United States Patent
Subrahmanyam et al.

(10) Patent No.: US 12,424,513 B2
(45) Date of Patent: Sep. 23, 2025

(54) TECHNOLOGIES FOR ISOLATED HEAT DISSIPATING DEVICES

(71) Applicant: Intel Corporation, Santa Clara, CA (US)

(72) Inventors: Prabhakar Subrahmanyam, San Jose, CA (US); Tong Wa Chao, San Jose, CA (US); Ying-Feng Pang, San Jose, CA (US); Yi Xia, Campbell, CA (US); Rahima K. Mohammed, San Jose, CA (US); Victor P. Polyanko, San Jose, CA (US); Ridvan A. Sahan, Sunnyvale, CA (US); Guangying Zhang, Shanghai (CN); Guoliang Ying, Shanghai (CN); Chuanlou Wang, Shanghai (CN); Jun Lu, Shanghai (CN); Liguang Du, Shanghai (CN); Peng Wei, Shangha (CN); Xiang Que, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 18/034,133

(22) PCT Filed: Mar. 6, 2021

(86) PCT No.: PCT/CN2021/079425
§ 371 (c)(1),
(2) Date: Apr. 27, 2023

(87) PCT Pub. No.: WO2022/187986
PCT Pub. Date: Sep. 15, 2022

(65) Prior Publication Data
US 2023/0420338 A1  Dec. 28, 2023

(51) Int. Cl.
*H01L 23/473* (2006.01)
*G06F 1/20* (2006.01)
*H01L 23/367* (2006.01)

(52) U.S. Cl.
CPC ............ *H01L 23/473* (2013.01); *G06F 1/206* (2013.01); *H01L 23/3672* (2013.01); *G06F 2200/201* (2013.01)

(58) Field of Classification Search
CPC .......... H05K 7/20254; H05K 7/20263; H05K 7/20272; H05K 7/20281; H05K 7/2029;
(Continued)

(56) References Cited

U.S. PATENT DOCUMENTS 3,512,582 A * 5/1970 Chu ...................... H01L 23/427
174/15.1
3,725,566 A * 4/1973 Plizak ...................... F28C 3/08
174/15.1

(Continued)

FOREIGN PATENT DOCUMENTS

| CN | 106033749 | 10/2016 |
|---|---|---|
| CN | 108511404 | 9/2018 |
| CN | 110010564 | 7/2019 |

OTHER PUBLICATIONS

International Searching Authority, "International Preliminary Report on Patentability," issued in connection with International Patent Application No. PCT/CN2021/079425, issued on Sep. 12, 2023, 5 pages.

(Continued)

*Primary Examiner* — Amir A Jalali
(74) *Attorney, Agent, or Firm* — Hanley, Flight & Zimmerman, LLC

(57) ABSTRACT

Techniques for heat sinks and cold plates for compute systems are disclosed. In one embodiment, a heat sink includes two sub-heat sinks that are mechanically connected (Continued)

but thermally isolated. The two sub-heat sinks can independently cool different dies on the same integrated circuit component. In another embodiment, a system includes an integrated circuit component that is cooled by a first water block and a second water block. The first water block forms a loop with a gap in it, and the second water block has a pedestal that extends through the gap in the first water block to contact the integrated circuit component. The first water block and the second water block can independently cool different dies on the same integrated circuit component.

19 Claims, 16 Drawing Sheets

(58) Field of Classification Search
CPC .......... H05K 7/20327; H05K 7/20336; H05K 7/2039; H05K 7/20409; H05K 7/20418; H05K 7/205; H05K 7/20508; H05K 7/20772; H05K 7/20781; H05K 7/20809; H05K 7/209; H05K 7/20927; H05K 7/20936; H05K 1/0201–0203; H01L 23/367; H01L 23/3672; H01L 23/3675; H01L 23/473; H01L 23/49568; H01L 25/0655; H01L 25/105; H01L 25/18; G06F 1/20; G06F 1/203; G06F 1/206
See application file for complete search history.

(56) References Cited

U.S. PATENT DOCUMENTS

| | | | | |
|---|---|---|---|---|
| 6,619,044 | B2 * | 9/2003 | Batchelor | F28F 1/045 62/3.2 |
| 7,948,077 | B2 * | 5/2011 | Andry | H01L 23/473 257/713 |
| 9,357,675 | B2 * | 5/2016 | Campbell | B23P 15/26 |
| 10,477,725 | B2 * | 11/2019 | Chen | H05K 7/20272 |
| 10,966,352 | B2 * | 3/2021 | Iyengar | H01L 23/427 |
| 2013/0206375 | A1 * | 8/2013 | Yoshida | H05K 7/20927 165/170 |
| 2016/0212878 | A1 * | 7/2016 | Quinn | H05K 7/2039 |
| 2017/0235350 | A1 * | 8/2017 | Tsai | G06F 1/20 165/80.4 |
| 2018/0005985 | A1 | 1/2018 | Hsieh | |
| 2018/0172365 | A1 * | 6/2018 | Tsai | H01L 23/34 |
| 2018/0247880 | A1 | 8/2018 | Fu et al. | |
| 2018/0263137 | A1 * | 9/2018 | Jensen | G06F 1/20 |
| 2019/0093963 | A1 * | 3/2019 | Chen | H05K 7/20772 |
| 2019/0198416 | A1 | 6/2019 | Neal et al. | |
| 2019/0348345 | A1 * | 11/2019 | Parida | H01L 25/18 |
| 2020/0161215 | A1 * | 5/2020 | McNamara | H01L 23/3672 |
| 2021/0216121 | A1 * | 7/2021 | Weldon | G06F 1/203 |

OTHER PUBLICATIONS

International Search Report and Written Opinion issued in connection with International Patent Application No. PCT/CN2021/079425 on Dec. 2, 2021, 6 pages.

* cited by examiner

TECHNOLOGIES FOR ISOLATED HEAT DISSIPATING DEVICES

BACKGROUND

Packages with more than one chip are becoming more common, such as a multi-chip package with one or more processor dies and one or more memory dies packaged together under one integrated heat spreader (IHS). Each die may have different power usage and different acceptable temperature ranges. In some cases, heat may flow through the IHS from the area above a first die to the area above a second die, inhibiting heat transfer from the second die. The first or second die may be throttled to stay within an acceptable temperature range.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
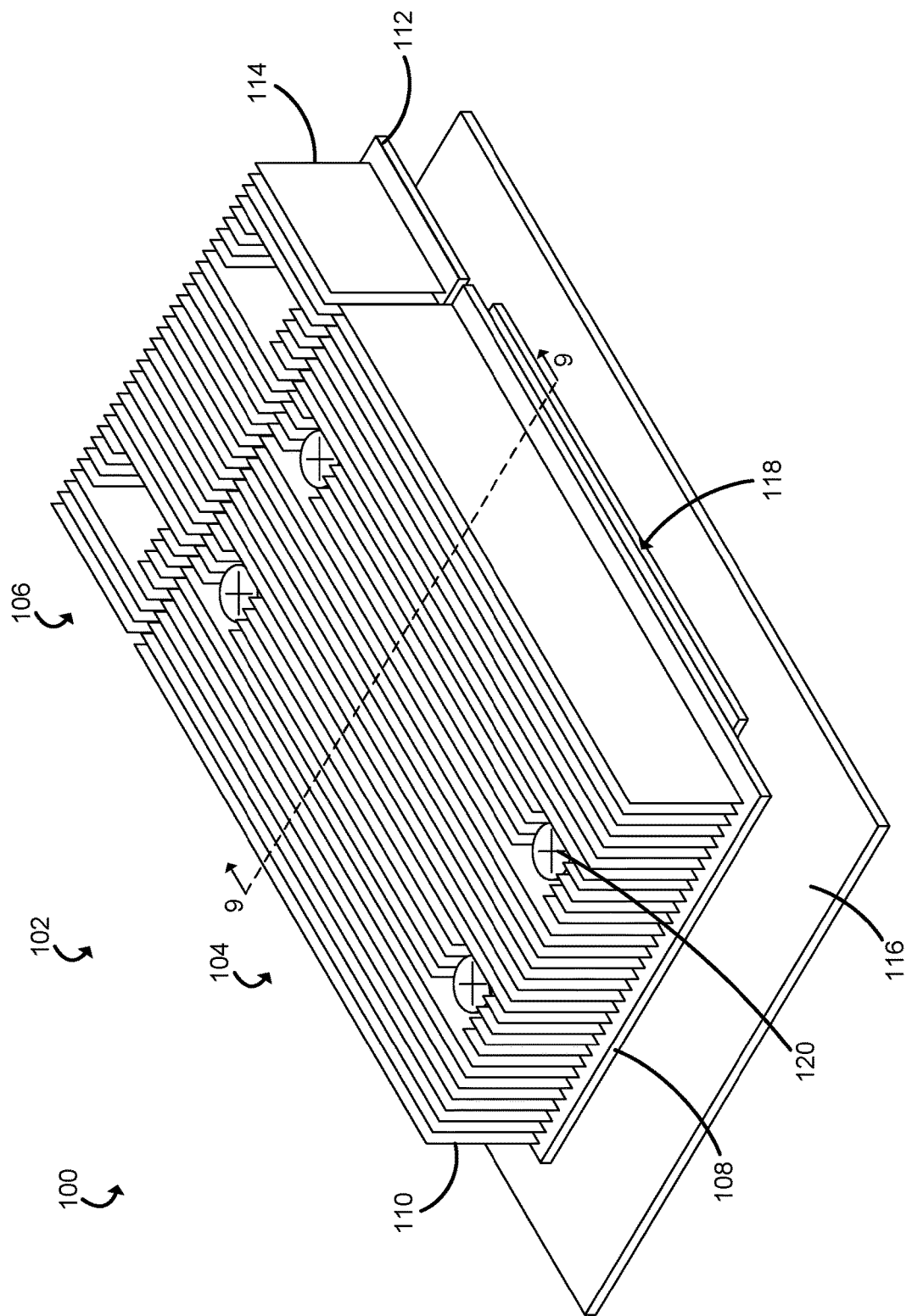
FIG. 1 is a perspective view of a simplified diagram of at least one embodiment of a system with a thermally isolated and mechanically integrated heat sink.

For multi-chip packages and other collections of integrated circuits, the various integrated circuit dies may require different thermal control. One approach of coupling all components in a package to a single heat sink or cold plate can work in some cases, but, in other cases, separate thermal control would be beneficial to prevent or reduce thermal cross-talk between the dies.

In order to address the limitations of one heat sink, in one embodiment, a heat sink can be split into a first sub-heat sink and a second sub-heat sink, where the first sub-heat sink is mechanically integrated with but thermally isolated from the second sub-heat sink. For example, in one embodiment, one or more graphics processing chips are packaged together with one or more high-bandwidth memory (HBM) chips. An integrated heat spreader (IHS) spreads the heat from the graphics processing chips separately from the heat from the HBM chips. The first sub-heat sink of the heat sink has a pedestal coupling a heat sink base and heat sink fins to the IHS above the graphics processing chips. The second sub-heat sink of the heat sink has one or more heat pipes coupling a second heat sink base and heat sink fins to the IHS above the HBM chips. Other embodiments, such as those with cold plates and thermo-electric coolers, are disclosed as well.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. The term "coupled," "connected," and "associated" may indicate elements electrically, electromagnetically, thermally, and/or physically (e.g., mechanically or chemically) co-operate or interact with each other, and do not exclude the presence of intermediate elements between the coupled, connected, or associated items absent specific contrary language. Terms modified by the word "substantially" include arrangements, orientations, spacings, or positions that vary slightly from the meaning of the unmodified term. For example, surfaces described as being substantially parallel to each other may be off of being parallel with each other by a few degrees.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives within the scope of the claims.

Figure 2:
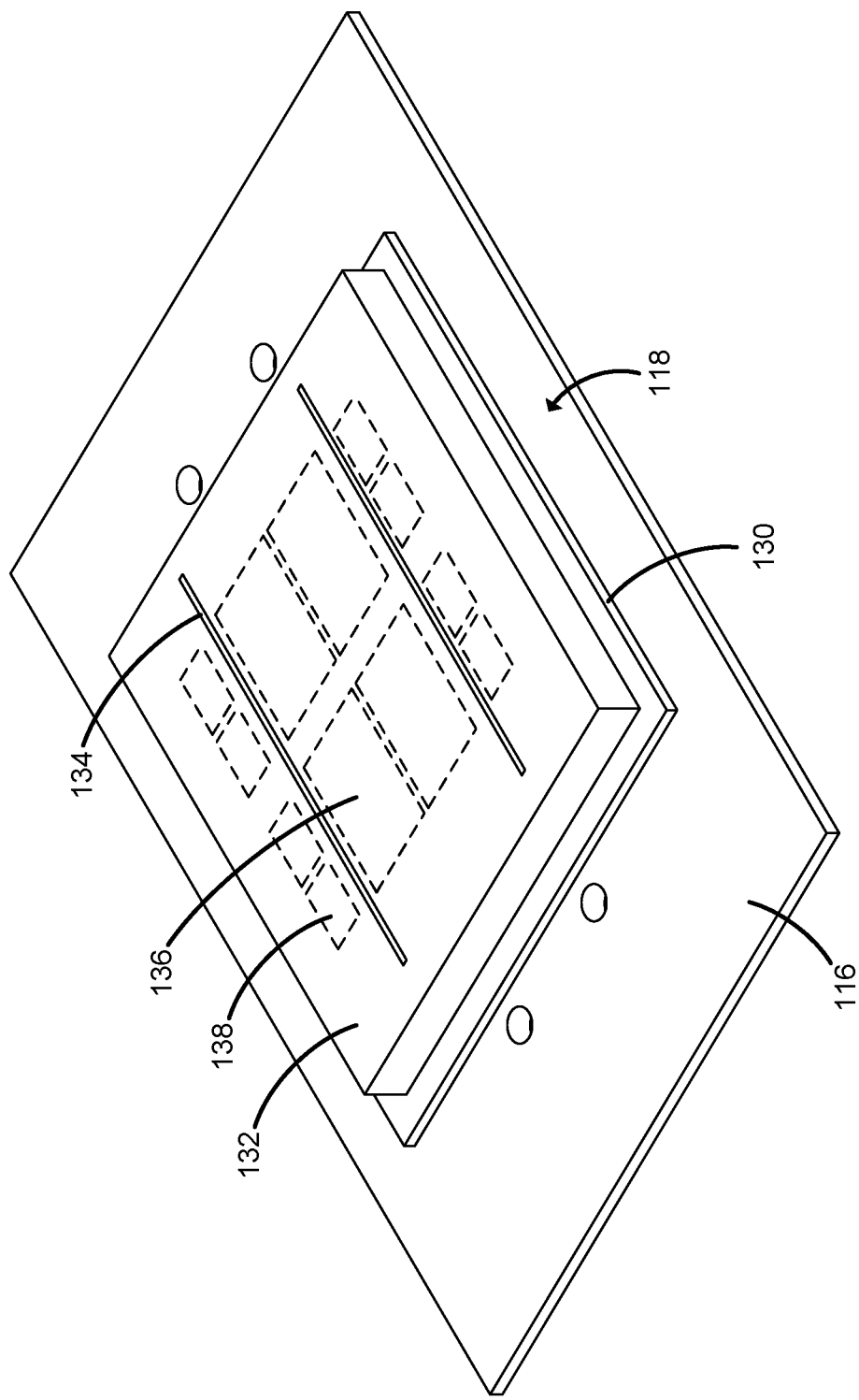
FIG. 2 is a perspective view of an integrated circuit component and system board of the system of FIG. 1.
Figure 3:
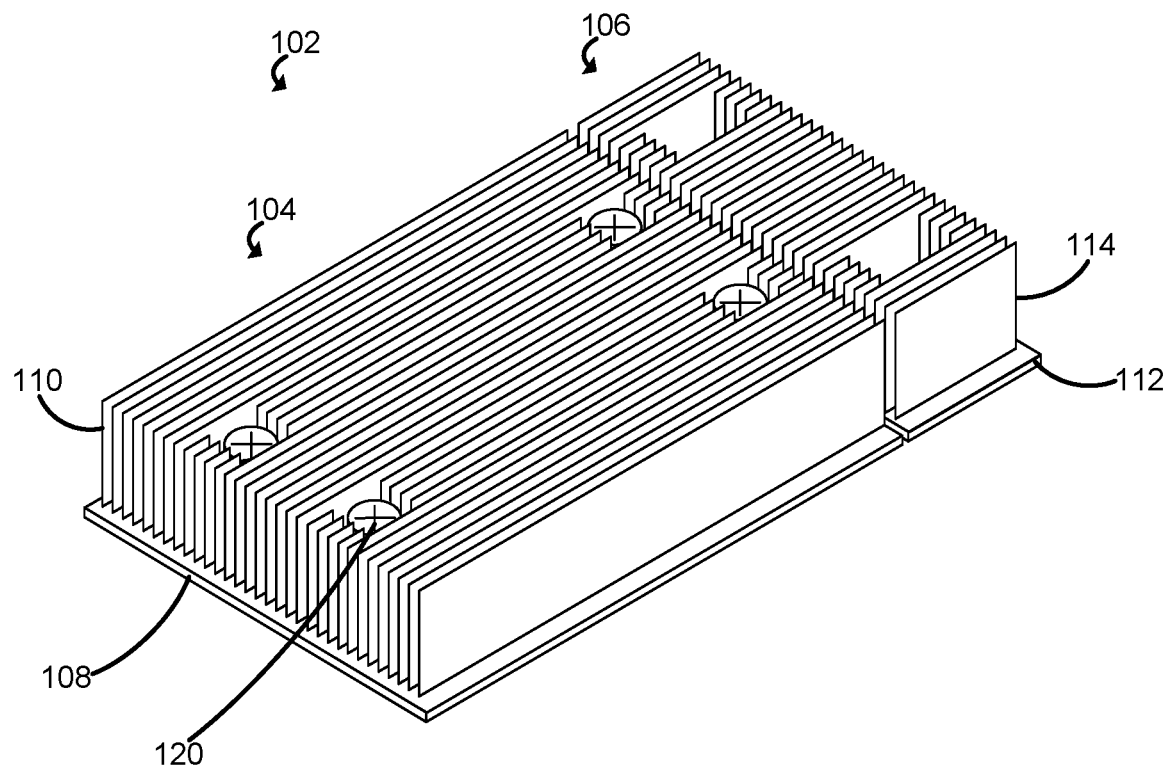
FIG. 3 is a perspective view of the heat sink of the system of FIG. 1.
Figure 9:
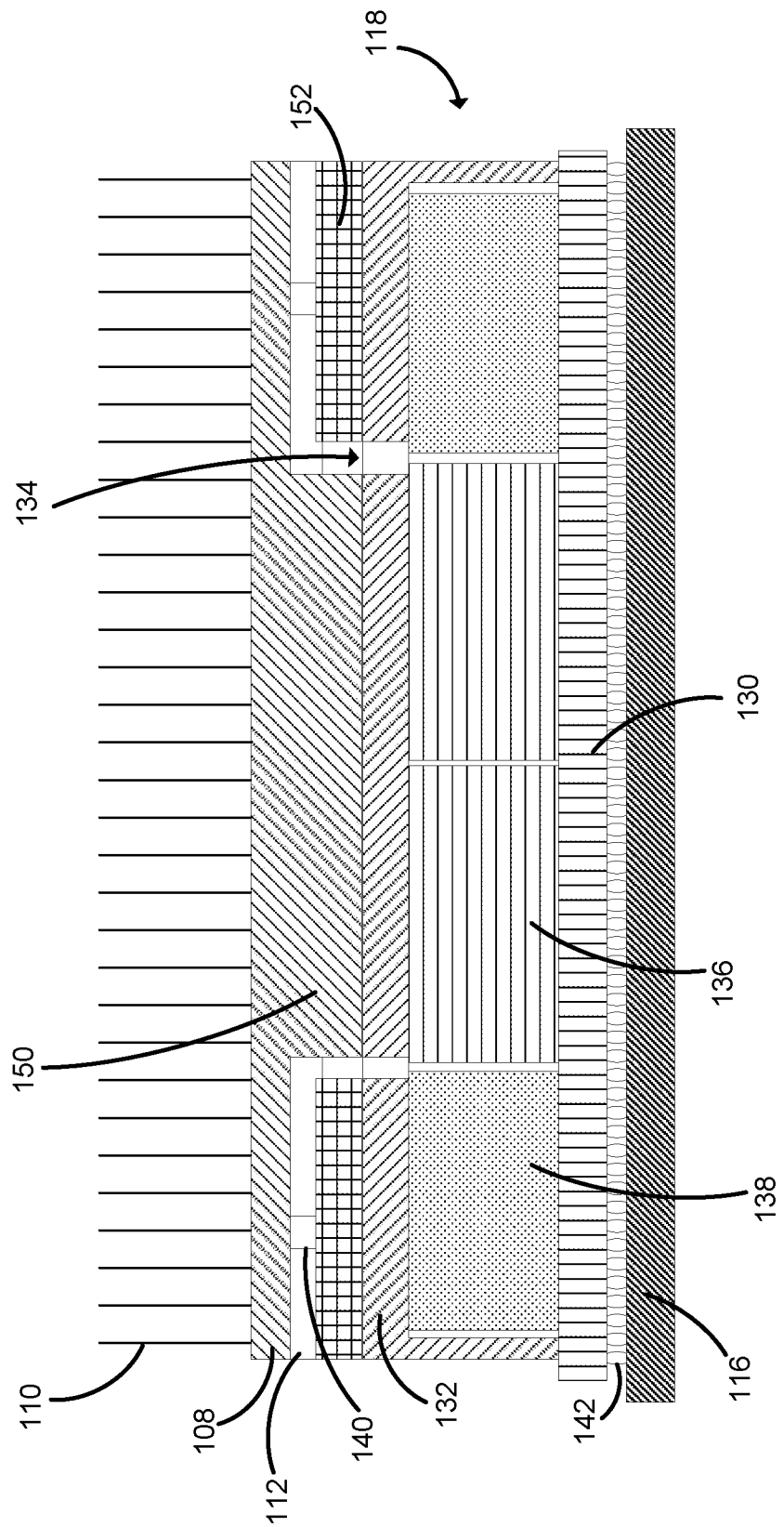
FIG. 9 is a cross-section view of the system of FIG. 1.

Referring now to FIGS. 1-9, in one embodiment, an illustrative system 100 shown in FIG. 1 includes a heat sink 102, an integrated circuit component 118 (not visible in FIG. 1), and a system board 116. FIG. 2 shows the integrated circuit component 118 and the system board 116 without the heat sink 102. FIGS. 3-8 show various views of the heat sink 102, and FIG. 9 shows a cross-section view of the system 100. As shown in FIG. 2, the integrated circuit component 118 includes an integrated heat spreader (IHS) 132 mounted on a substrate 130. In the illustrative embodiment, the integrated circuit component 118 includes one or more graphics processing dies 136 and one or more high-bandwidth memory (HBM) dies 138 covered by the IHS 132. The illustrative IHS 132 has two slots 134, thermally isolating the portion of the IHS 132 covering the graphics processing dies 136 from the portion of the IHS 132 covering the HBM dies 138. The thermal isolation of different areas of the IHS 132 allows the heat sink 102 to thermally couple to the HBM dies 138 independently from the graphics processing dies 136.

Figure 4:
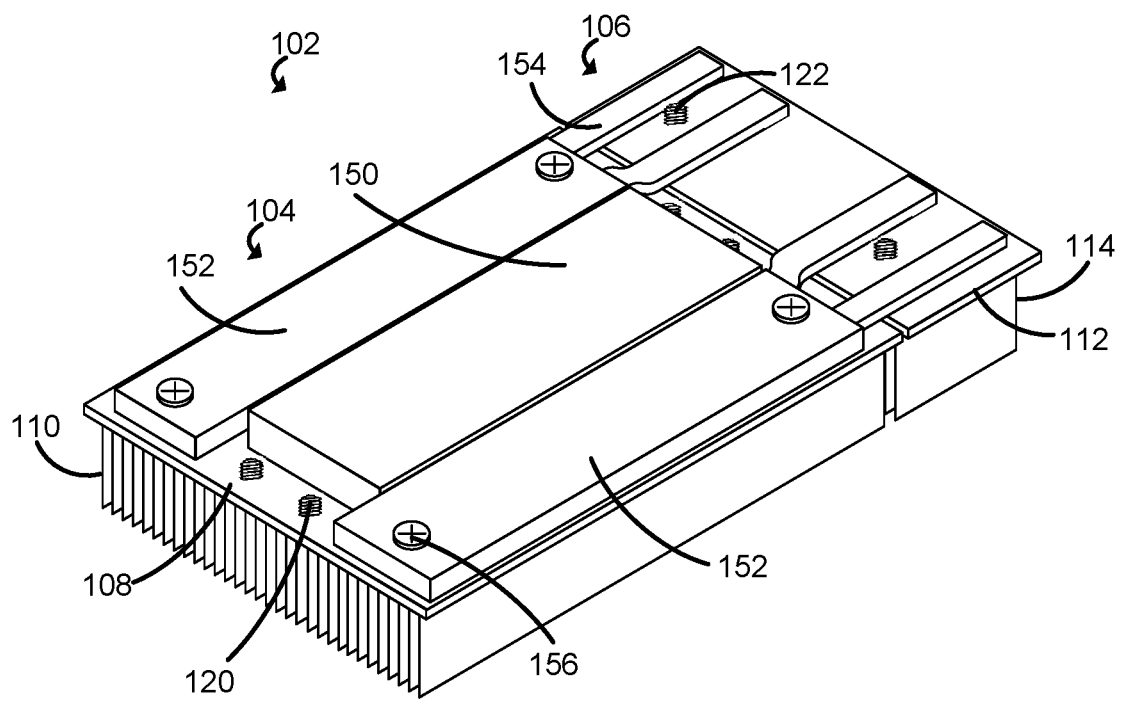
FIG. 4 is a perspective view of a bottom of the heat sink of the system of FIG. 1.
Figure 5:
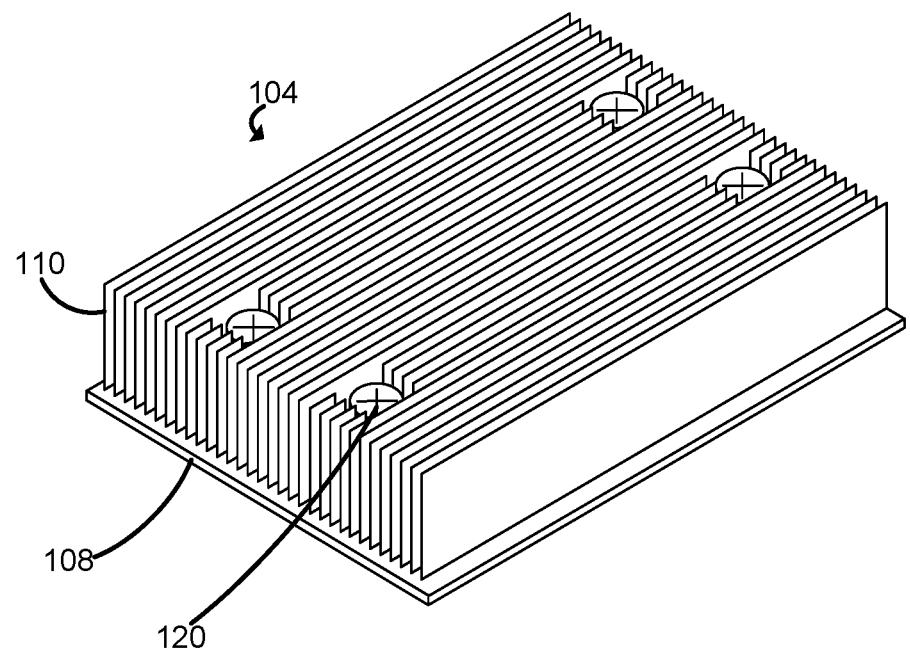
FIG. 5 is a perspective view of a first sub-heat sink of the heat sink of the system of FIG. 1.
Figure 6:
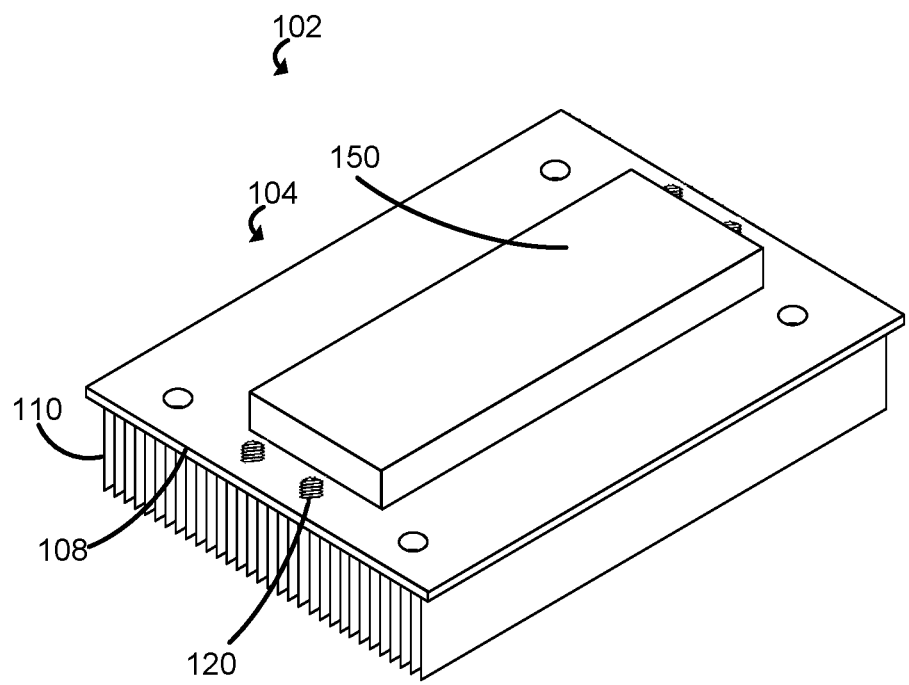
FIG. 6 is a perspective view of a bottom of the first sub-heat sink of the heat sink of the system of FIG. 1.
Figure 7:
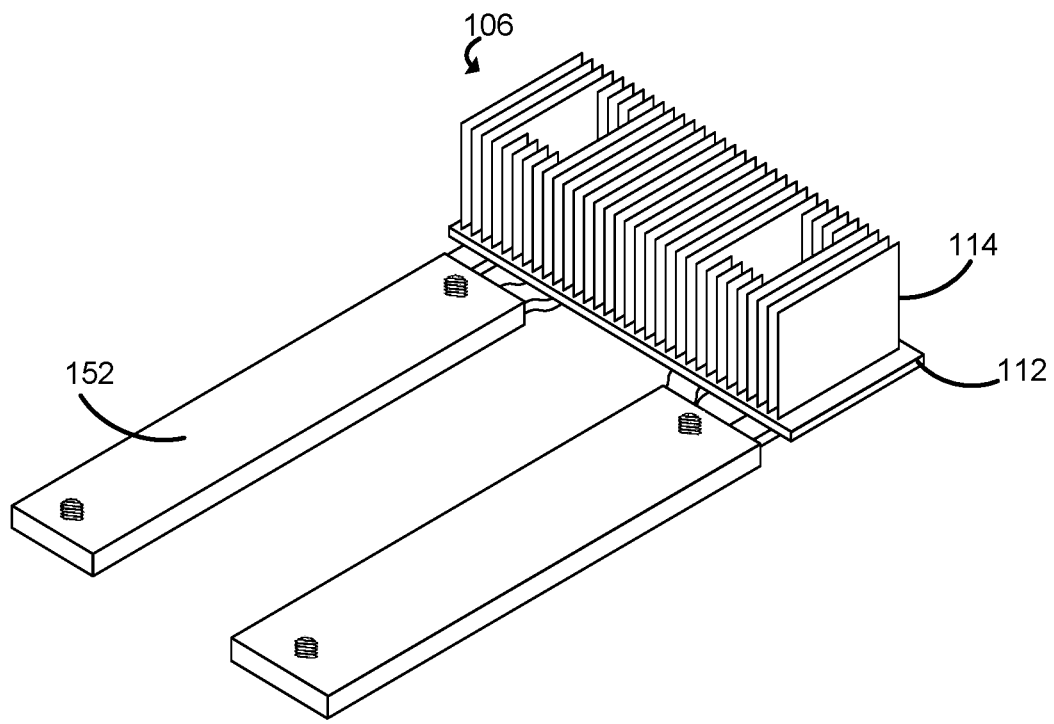
FIG. 7 is a perspective view of a second sub-heat sink of the heat sink of the system of FIG. 1.
Figure 8:
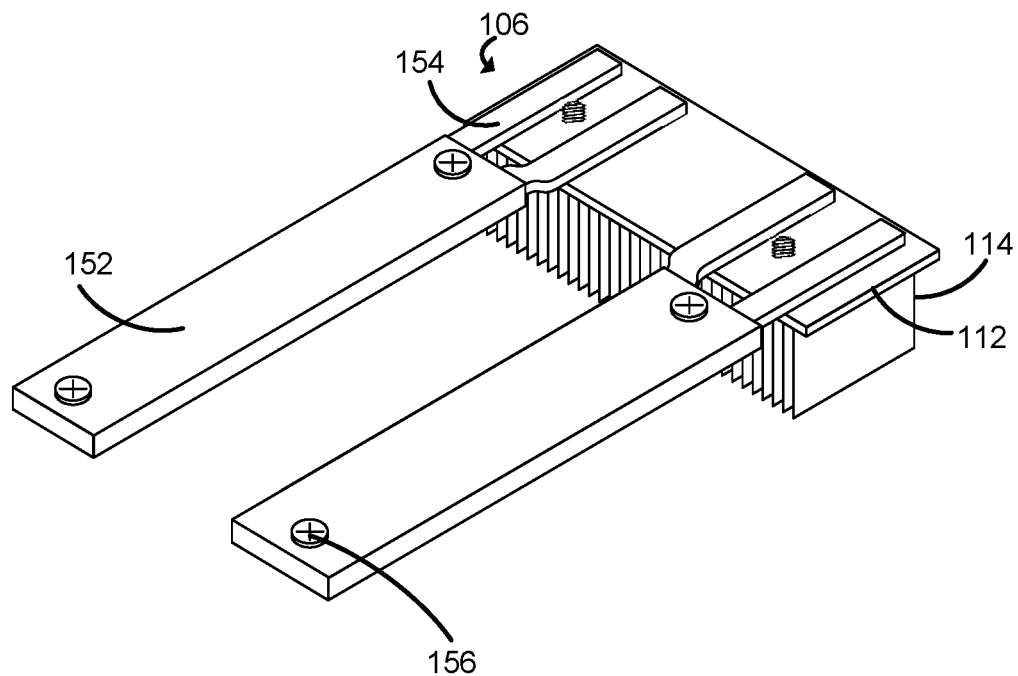
FIG. 8 is a perspective view of a bottom of the second first sub-heat sink of the heat sink of the system of FIG. 1.

Referring now to FIGS. 3-8, the heat sink 102 includes a first sub-heat sink 104 and a second sub-heat sink 106. In the illustrative embodiment, the first sub-heat sink 104 is thermally coupled to the graphics processing dies 136, and the second sub-heat sink 106 is thermally coupled to the HBM dies 138. As shown in FIG. 4, a pedestal 150 rises from a base 108 of the first sub-heat sink 104, and, when the heat sink 102 is in place, the pedestal 150 contacts the IHS 132 above the graphics processing dies 136. Similarly, when the heat sink 102 is in place, pedestals 152 contact the IHS 132 about the HBM dies 138, transferring heat from the IHS 132 to a base 112 of the second sub-heat sink 106 with use of one or more heat pipes 154. It should be appreciated that the pedestals 152 do not directly contact the pedestal 150 or the base 108 of the first sub-heat sink 104. As such, the pedestals 152 of the second sub-heat sink 106 are not thermally coupled to the pedestal 150 of the base 108 of the second sub-heat sink 106. In the illustrative embodiment, air is blown across the fins 114 of the second sub-heat sink 106, and the air then flows across the fins 110 of the first sub-heat sink 108.

It should be appreciated that, in the illustrative embodiment, the second sub-heat sink 106 is mechanically coupled to the first sub-heat sink 104. In the illustrative example, four screws 156 fasten the pedestals 152 of the second sub-heat sink 106 to the base 108 of the first sub-heat sink 104. A spacer 140 is used to prevent the pedestals 152 of the second sub-heat sink 106 from contacting the base 108 of the first sub-heat sink 104 (see FIG. 9). Because the first sub-heat sink 104 and the second sub-heat sink 106 are mechanically coupled, the heat sink 102 can be fastened to the system board 116 (such as by using spring screws 120) all at once, thermally coupling both the first sub-heat sink 104 to the graphics processing dies 136 and the second sub-heat sink 106 to the HBM dies 138. As used herein, the phrase "thermally coupled" refers to components that are coupled to facilitate the transfer of heat.

As used herein, the term "integrated circuit component" refers to a packaged or unpacked integrated circuit product. A packaged integrated circuit component comprises one or more integrated circuits. In one example, a packaged integrated circuit component contains one or more processor units and a land grid array (LGA) or pin grid array (PGA) on an exterior surface of the package. In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any of computing system component or type of component described or referenced herein, such as a processor unit (e.g., system-on-a-chip (SoC), processor cores, graphics processor unit (GPU), accelerator), I/O controller, chipset processor, memory, network interface controller, or a three-dimensional integrated circuit (3D IC) face-to-face-based packaging chip such as an Intel® Foveros chip. In one embodiment, the integrated circuit component 118 is a processor unit, such as a single-core processor, a multi-core processor, a desktop processor, a server processor, a data processing unit, a central processing unit, a graphics processing unit, etc. The processor unit may include an integrated memory, such as a high-bandwidth memory. The integrated circuit component 118 may include one or more chips integrated into a multi-chip package (MCP).

In the illustrative embodiment, the various dies of the integrated circuit component are spaced apart a small amount, as shown in FIG. 9. For example, the HBM dies 138 may be spaced apart 0.1-1 millimeter from the graphics processing dies 136. As such, the HBM dies 138 and graphics processing dies 136 are not thermally coupled.

The illustrative integrated circuit component 118 includes an IHS 132. The IHS 132 is in thermal contact with the dies of the integrated circuit component 118, either directly or through one or more intermediate layers, such as a thermal interface material (TIM). The illustrative IHS 132 is made out of nickel-plated copper. In other embodiments, the IHS 132 may be made out of or otherwise include any suitable material, such as copper, aluminum, gold, or other high-thermal-conductivity material. In some embodiments, the integrated circuit component 118 may not include an IHS. In such an embodiment, the pedestals 150, 152 of the heat sink 102 may contact the dies included in the integrated circuit component 118 without an intermediate IHS. It should be appreciated that, in those embodiments, there may still be other layers such as a TIM between the heat sink 102 and the bare integrated circuit die(s) of the integrated circuit component 118. In such embodiments, the various dies of the integrated circuit component 118 may have different heights, and the contact surfaces of the pedestals 150, 152 may be at different heights to contact the corresponding dies of the integrated circuit component 118.

The illustrative IHS 132 may be any suitable size. The illustrative IHS 132 has a width of about 30 millimeters, a length of about 60 millimeters, and a height of 5 millimeters. In other embodiments, the IHS 132 may have any suitable dimensions, such as a length and/or width of 50-200 millimeters and a height of 0.5-20 millimeters.

It should be appreciated that the IHS 132 may have a shape other than the box shape shown in the figures. For example, in some embodiments, the IHS 132 may have more than one level. For example, in one embodiment, the IHS 132 may have a top surface that contacts the pedestal 150 of the first sub-heat sink 104. The IHS 132 may also have a lower tier surrounding the top surface, providing a second surface that the pedestal 152 of the second sub-heat sink 106 can contact.

The illustrative substrate 130 includes interconnects to connect electrical paths of the dies of the integrated circuit component 118 both to each other and to external connections, such as to pins of a socket or solder bumps. In some embodiments, the substrate 130 may include embedded multi-die interconnect bridge (EMIB) technology. In the illustrative embodiment, the substrate 130 includes a land grid array with a pad corresponding to each pin 142 (see FIG. 9). Each pad may be any suitable material, such as gold, copper, silver, gold-plated copper, etc. Additionally or alternatively, in some embodiments, the substrate 130 may include a pin grid array with one or more pins that mate with a corresponding pin socket in a processor socket or a ball grid array. The substrate 130 may include one or more additional components, such as a capacitor, voltage regulator, etc. The illustrative substrate 130 is a fiberglass board made of glass fibers and a resin, such as FR-4. In other embodiments, the substrate 130 may be embodied as any suitable circuit board.

In the illustrative embodiment, the substrate 130 has larger dimensions that the IHS 132 and/or the dies mounted on the substrate 130. The illustrative substrate 130 has a width of about 40 millimeters, a length of about 70 millimeters, and a height of 3 millimeters. In other embodiments, the substrate 130 may have any suitable dimensions, such as a length and/or width of 50-200 millimeters and a height of 0.5-20 millimeters. In some embodiments, the substrate 130 may not extend past the IHS 132. In other embodiments, the integrated circuit component 118 may not include a separate substrate 130. Rather, the dies or other components inside a package may, e.g., contact pins on a processor socket directly.

In the illustrative embodiment, the integrated circuit component 118 may have a thermal interface material (TIM) layer between some or all of the dies and the IHS 132. A TIM layer can be any suitable material, such as a silver thermal compound, thermal grease, phase change materials, indium foils or graphite sheets. Additionally or alternatively, there may be a TIM layer between the integrated circuit component and the heat sink 102.

The various dies of the integrated circuit component 118 may generate any suitable amount of heat. For example, in one embodiment, the integrated circuit component 118 may generate up to 500 Watts of power. The power may be split between the various dies in any suitable manner. For example, in one embodiment, the HBM dies 138 may generate, e.g., 1-200 Watts of power, and the graphics processing dies 136 may generate, e.g., 1-300 Watts of power, depending on workload. It should be appreciated that, as the dies are cooled separately, the acceptable temperature ranges can be different. For example, in one embodiment, the HBM dies 138 may be maintained at a temperature of less than 80° C. and the graphics processing dies 136 may be maintained at a temperature of less than 100° C. More generally, any die may generate, e.g., 1-500 Watts and may be maintained at less than any suitable temperature, such as 50-150° C.

The first sub-heat sink 104 has a heat sink base 108 and several heat sink fins 110. The fins 110 may be any suitable structure that has a high surface area-to-volume ratio. The fins 110 may be any suitable shape, such as a plane, a rod, a folded sheet, etc. In the illustrative embodiment, the heat sink fins 110 are bonded to the heat sink base 108 by solder, glue, or other adhesive. In other embodiments, the heat sink fins 110 may be removably fastened to the heat sink base 108. The pedestal 150 may be an integral part of the base 108 or may be a separate component that is fastened or adhered to the base 108. In some embodiments, the first sub-heat sink 104 may be a unitary piece that includes both the heat sink base 108 and the heat sink fins 110. More generally, the first heat sink 104 may be manufactured in any suitable manner, such as extrusion, skiving, stamping, forging, machining, 3D printing, etc.

One purpose of the first sub-heat sink 104 is to absorb heat from the integrated circuit component 118 and transfer the heat to air. In some embodiments, a fan (not shown in FIGS. 1-9) may blow air onto and/or through the heat sink fins 110.

The first sub-heat sink 104 may be made from any suitable material. In the illustrative embodiment, the heat sink base 108 and the heat sink fins 110 are made from a high-thermal-conductivity material, such as copper, aluminum, or another material with a thermal conductivity greater than 100 W/(m×K). In some embodiments, the heat sink base 108 and the heat sink fins 110 may be made of different material. For example, the heat sink base 108 may be aluminum and the heat sink fins 110 may be copper. In some embodiments, the heat sink base 108 may have more than one layer of different materials.

The first sub-heat sink 104 may have any suitable shape or dimensions. For example, the first sub-heat sink 104 may have a width of 10-250 millimeters, a length of 10-250 millimeters, and/or a height of 10-100 millimeters. In the illustrative embodiment, the first sub-heat sink 104 has a width of about 75 millimeters, a length of about 150 millimeters, and a height of about 30 millimeters. The thickness of the base plate 108 may be any suitable thickness, such as 1-10 millimeters. In the illustrative embodiment, the base plate 104 has a thickness of about 5 millimeters. The dimensions of the pedestal 150 may be any suitable dimensions, such as a width of 10-150 millimeters, a length of 10-150 millimeters, and/or a height of 2-25 millimeters. In the illustrative embodiment, the pedestal 150 has a height of 10 millimeters. The height of the fins 110 may be any suitable height, such as 5-100 millimeters.

The first sub-heat sink 104 is a rectangular shape. In other embodiments, the first sub-heat sink 104 may be any suitable shape, such as a square, a circle, etc. The illustrative heat sink base 108 has a flat surface on the bottom. In the illustrative embodiment, the pedestal 150 contacts the flat surface of the IHS 132 above the graphics processing dies 136. Heat flows from the pedestal 150 to the central region of the heat sink base 108 to the edges of the heat sink base 108 and into the fins 110. In some embodiments, one or more heat pipes may be present in the first sub-heat sink 104 (such as embedded in or in contact with the heat sink base 108) to transfer heat from a central region of the heat sink base 108 to the edges of the heat sink base 108. In some embodiments, the heat sink 102 may include other heat-transferring components such as a thermoelectric heater/cooler, etc.

The second sub-heat sink 106 is, in the illustrative embodiment, constructed similarly to the first sub-heat sink 104. For example, the heat sink base 112 and heat sink fins 114 may be similar to the heat sink base 108 and heat sink fins 110, respectively, a description of which will not be repeated in the interest of clarity. The length of the illustrative heat sink base 112 is about 50 millimeters.

The pedestals 152 are configured to conduct heat from the IHS 132 to the heat sink base 112. In the illustrative embodiment, heat pipes 154 conduct heat from the pedestals 152 to the heat sink base 112. The pedestals 152 may be any suitable material, such as copper, aluminum, or other material with a high thermal conductivity. The pedestals 152 may be any suitable dimensions, such as a width of 10-250 millimeters, a length of 10-250 millimeters, and/or a height of 2-20 millimeters. In the illustrative embodiment, the pedestals 152 have a width of about 20 millimeters, a length of about 10 millimeters, and a height of about 3 millimeters. In the illustrative embodiments, the lower surface of the pedestals 152 is coplanar with the lower surface of the pedestal 150, allowing both pedestals 150, 152 to contact the coplanar surface of the IHS 132 simultaneously. As there is a gap between the pedestals 152 and the heat sink base 108 of the first sub-heat sink 104, it should be appreciated that the height of the pedestals 152 is less than that of the pedestal 150.

In the illustrative embodiment, the second sub-heat sink 106 is fastened to the first sub-heat sink 104 by fasteners 156. In the illustrative embodiment, each of fasteners 156 is embodied as screws or bolts. In other embodiments, the second sub-heat sink 106 may be fastened to the first sub-heat sink by rivets, adhesives, or any other suitable mechanical connector that does not thermally couple the sub-heat sinks 104, 106. Spacers 140 may be used to ensure that the pedestal 152 is not thermally coupled to the heat sink base 108. The spacers 140 may be made out of any suitable material, such as a plastic with a low thermal conductivity. In some embodiments, the spacers 140 may be made out of a relatively high thermal conductivity material such as aluminum or steel. However, it should be appreciated that the cross-sectional area of the spacers 140 is so small compared to the surface area of the pedestals 152, that such spacers 140 would not cause the pedestals 152 to be thermally coupled to the heat sink base 108. In the illustrative embodiment, the gap between the pedestals 152 and the heat sink base 108 is empty (i.e., is an air gap filled with air). In some embodiments, an insulator may fill some or all of the gap between the pedestals and the heat sink base 108, further reducing heat flow between the components. For example, an insulator (e.g., an insulating foam) may be applied (e.g., sprayed) to the heat sink base 108 and/or pedestals 152, or an insulating layer may be epitaxially grown on the heat sink base 108 and/or pedestals 152

In some embodiments, the first sub-heat sink 104 and the second sub-heat sink 106 may be manufactured together in any suitable manner, such as extrusion, skiving, stamping, forging, machining, 3D printing, etc. In such an embodiment, the first sub-heat sink 104 and the second sub-heat sink 106 may be mechanically integrated without being thermally coupled.

The illustrative heat sink 102 is fastened to the system board 116 by fasteners 120. In the illustrative embodiment, fasteners 120 are embodied as screws or bolts. Fasteners 120 may have a spring that applies a downward force on the heat sink base 104. The fasteners 120 can screw directly into threaded holes of the system board 116 or may be secured by, e.g., a nut. Additionally or alternatively, the fasteners 120 may be embodied as any other suitable type of fastener, such as a torsion fastener, a spring screw, one or more clips, a land grid array (LGA) loading mechanism, and/or a combination of any suitable types of fasteners. In the illustrative embodiment, the fasteners 120 are removable. In other embodiments, some or all of the fasteners 120 may permanently secure the heat sink 102 to the system board 116. In some embodiments, the system board 116 may include a bolster plate and/or a back plate, and the fasteners 120 may fasten to the bolster plate and/or back plate.

In the illustrative embodiment, the system board 116 may be embodied as a peripheral card such as a graphics card. The peripheral card may be compatible with a peripheral component interconnect express (PCIe) standard. The system board 116 may include other components not shown, such as interconnects, other electrical components such as capacitors or resistors, sockets for components such as memory or peripheral cards, connectors for peripherals, etc. In other embodiments, the system board 116 may be form or be a part of another component of a computer system, a motherboard, a mezzanine board, a peripheral board, etc. The illustrative system board 116 is a fiberglass board made of glass fibers and a resin, such as FR-4. In other embodiments, other types of circuit boards may be used.

Referring now to FIG. 9, in one embodiment, a cross-sectional view of the system 100 is shown (corresponding to cross-section 9 in FIG. 1). As shown in FIG. 9, in the illustrative embodiment, the slots 134 create a gap between different portions of the IHS 132. In some embodiments, the slots 134 may not line up exactly with the gaps between the dies 136, 138. As long as adequate heat flows from the edges of the dies 136, 138 to the IHS 132, such a mismatch will not significantly impair cooling performance. In some embodiments, the slots 134 and/or the gaps between the dies 136, 138 may be filled by a thermally insulating material. The slots 134 may be any suitable dimensions, such as having a width of 0.1-2 millimeters and a length of 1-100 millimeters.

In the illustrative embodiment, the integrated circuit component 118 mates with several pins 142 shown in FIG. 9 through a land grid array with a pad corresponding to each pin 142. Additionally or alternatively, in some embodiments, the substrate 130 may include a pin grid array with one or more pins that mate with a corresponding pin socket in a processor socket or a ball grid array.

It should be appreciated that different configurations are envisioned beyond those shown in FIGS. 1-9. For example, in the illustrative embodiment, the second sub-heat sink 106 is in front of the first sub-heat sink 104 in the airflow path. In other embodiments, the second sub-heat sink 106 may be next to or behind the first sub-heat sink 104 in the airflow path. In the illustrative embodiment, the fins 114 of the second sub-heat sink 106 are at the same height as the fins 110 of the first sub-heat sink 104. In other embodiments, the fins of the different sub-heat sinks may be at different heights. In the illustrative embodiment, there are two sub-heat sinks. In other embodiments, there may be three or more sub-heat sinks. For example, each of several HBM dies 138 may have its own pedestal or its own sub-heat sink coupled to it. In the illustrative embodiment, the second sub-heat sink 106 is mechanically fastened to the first sub-heat sink 104. In other embodiments, the various sub-heat sinks may all be fastened to, e.g., a single bracket, that is then fastened to the system board 116. In the illustrative embodiment, the two sub-heat sinks 104, 106 are thermally coupled to a single integrated circuit component 118. In other embodiments, various sub-heat sinks may be coupled to different integrated circuit components, allowing separate thermal coupling of sub-heat sinks to different integrated circuit component packages with a single mechanical fastening to a system board 116. In the illustrative embodiment, the thermally isolated regions of the IHS 132 are coplanar and/or the dies 136, 138 are coplanar, and the pedestals 150, 152 of the sub-heat sinks 104, 106 are coplanar. In other embodiments, different pedestals of different sub-heat sinks may be at different heights to match different heights of different IHSs, different regions of different IHSs, or different dies 136, 138. In the illustrative embodiment, the pedestals 150, 152 connected to different base plates 108, 112. In other embodiments, different pedestals may connect to the same base plate. Even though the base plate will not fully thermally isolate the pedestals in such a scenario, the different pedestals may reduce thermal cross-talk between the components they are thermally coupled to. In the illustrative embodiment, the IHS 132 has a slot 134, thermally isolating different regions of the IHS 132. In other embodiments, the IHS 132 may not have a slot 134. Even though an IHS 132 without a slot 134 may increase thermal cross-talk between the dies 136, 138, the thermal isolation between the heat sinks 104, 106 may allow the dies 136, 138 to be cooled at least partially independently.

Referring now to FIGS. 10-17, in some embodiments, an illustrative system 100 shown in FIG. 1 includes a first water block 1002, a second water block 1004, an integrated circuit component 1028 (not visible in FIG. 10), and a system board 1026. In the illustrative embodiment, the first water block 1002 is thermally coupled to HBM dies 1034 (see FIGS. 11

Figure 13:
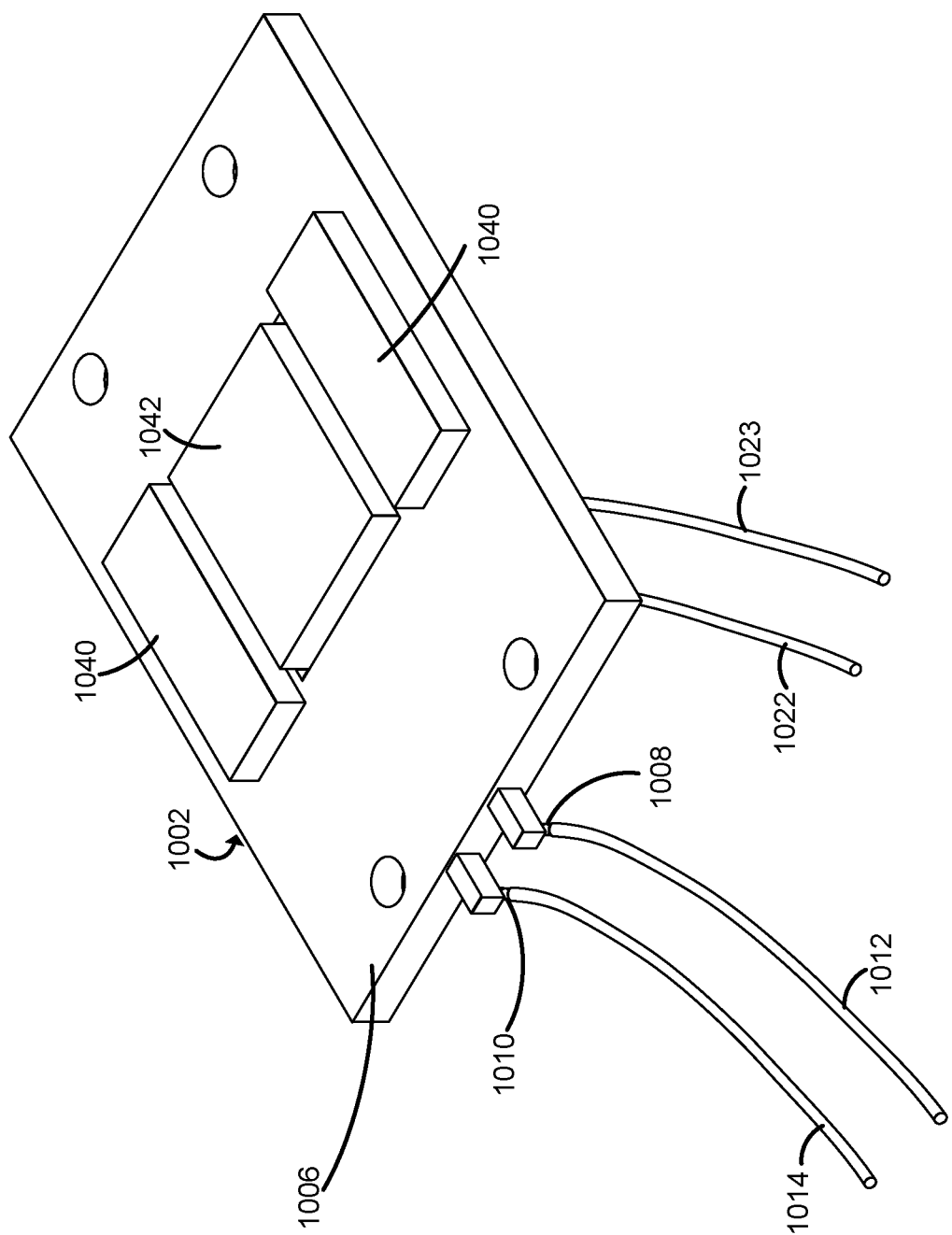
FIG. 13 is a perspective view of a bottom of the water blocks of the system of FIG.

& 12), and the second water block 1004 is thermally coupled to the processing dies 1036. As shown in FIG. 13, pedestals 1040 rise from a base 1006 of the first water block 1002, and, when the water block 1002 is in place, the pedestals 1040 contacts the IHS 132 above the HBM dies 1034 (or contacts the HBM dies 1034 directly). Similarly, when the second water block 1004 is in place, a pedestal 1042 contact the IHS 132 about the processing dies 1036 (or contacts the processing dies 1034 directly), transferring heat from the processing dies 1036 to 1018 of the second water block 1004. It should be appreciated that, in the illustrative embodiment the pedestal 1042 and base 1018 of the second water block do not directly contact the pedestals 1040 or the base 1006 of the first water block 1002. As such, the first water block 1002 is not thermally coupled to the second water block 1004.

Figure 11:
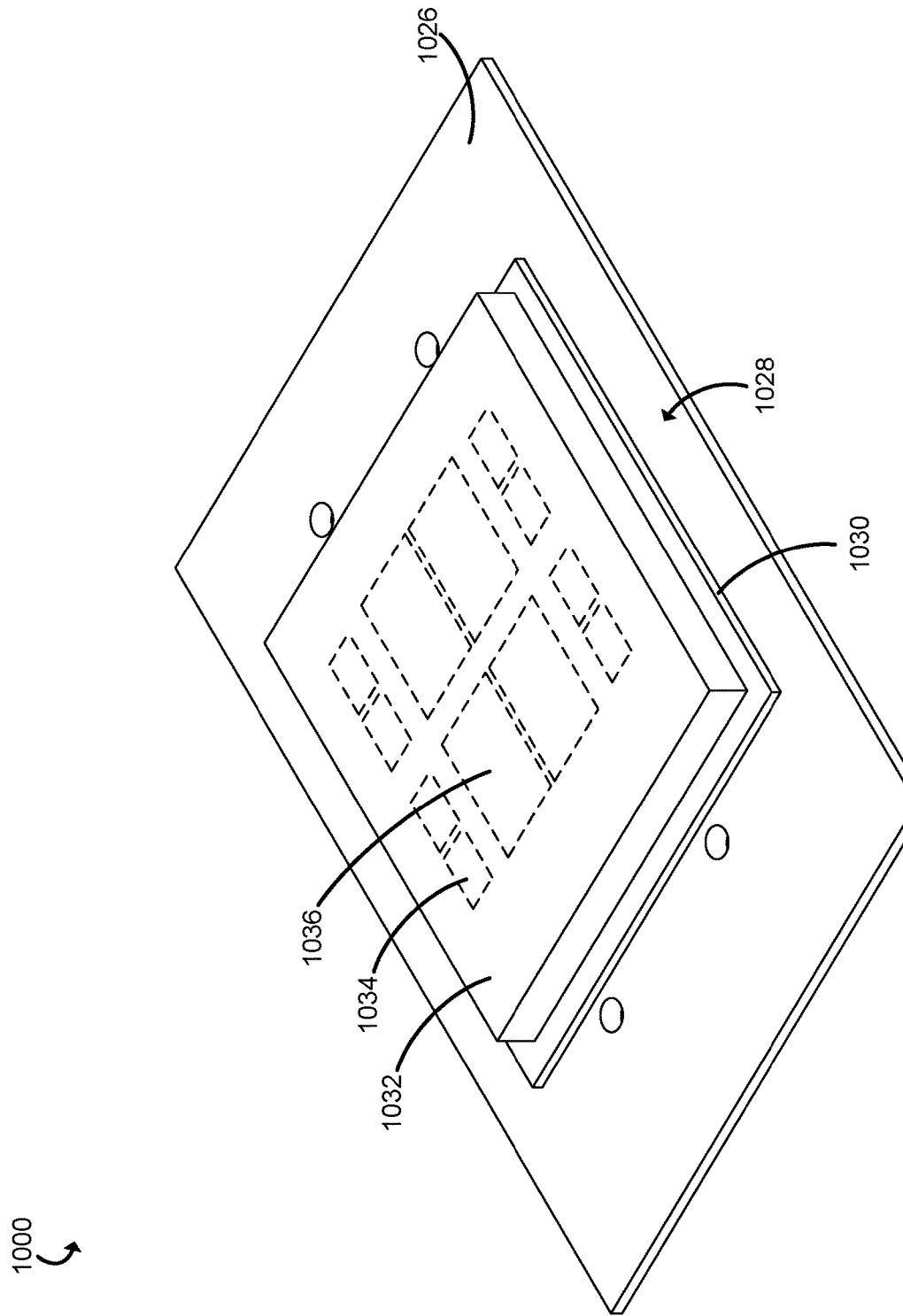
FIG. 11 is a perspective view of an integrated circuit component and system board of the system of FIG. 10.
Figure 12:
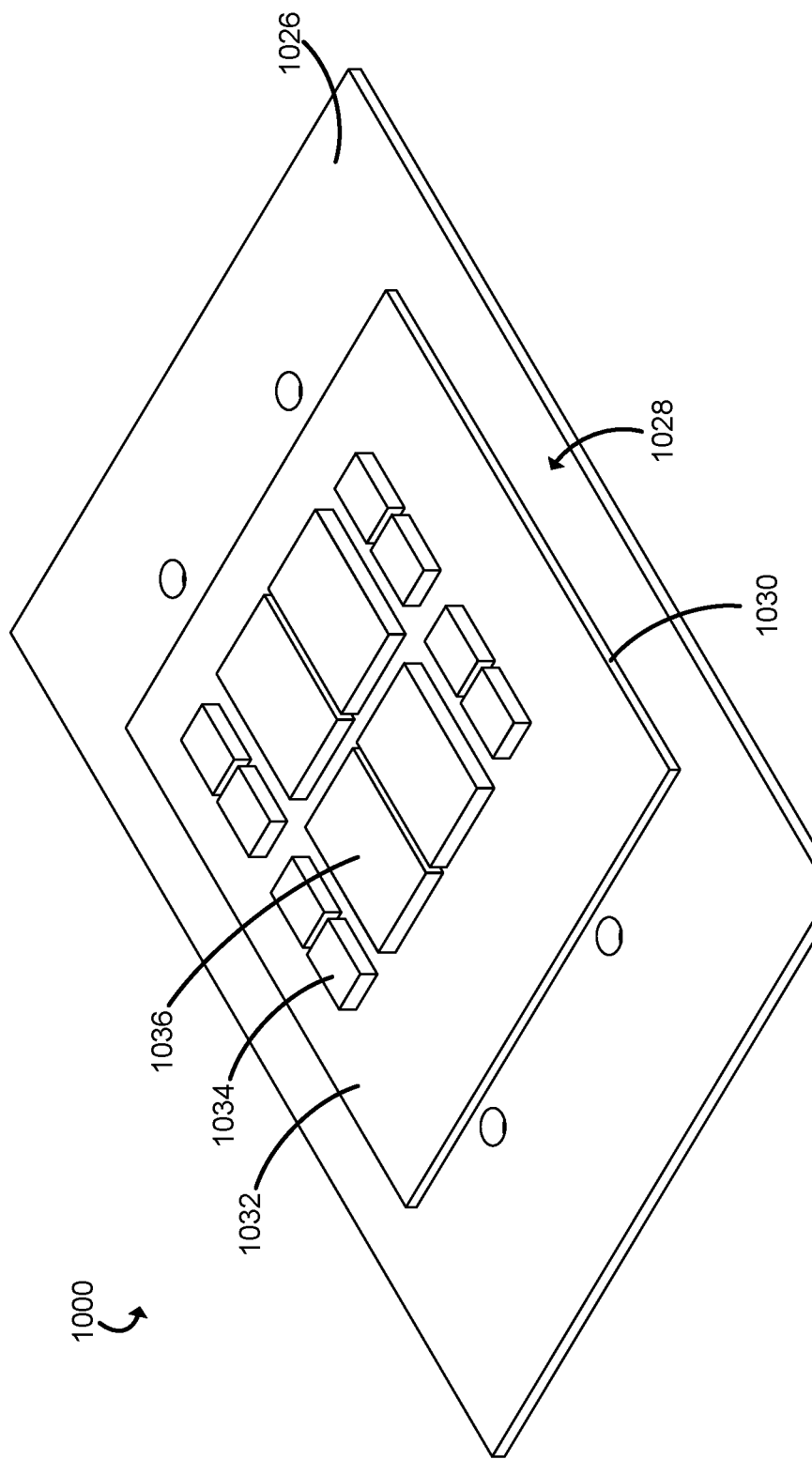
FIG. 12 is a perspective view of an integrated circuit component and system board of the system of FIG. 10.
Figure 14:
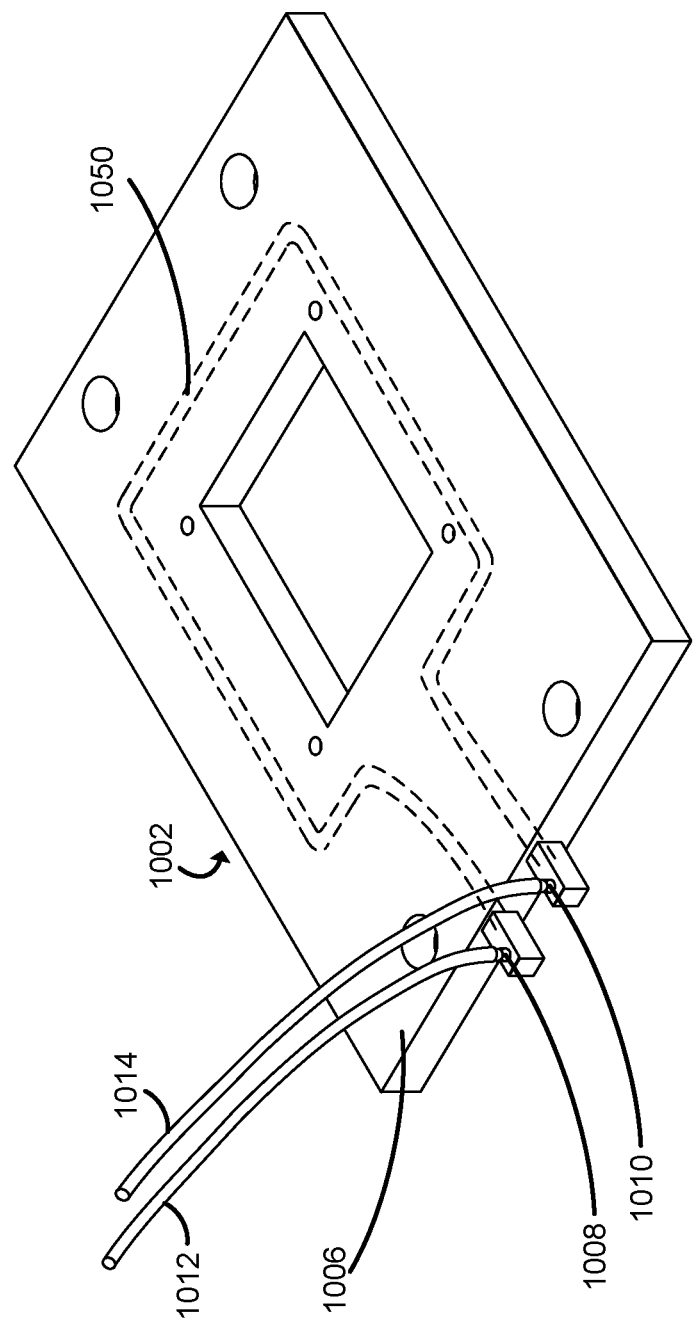
FIG. 14 is a perspective view of a first water block of the system of FIG. 10.
Figure 15:
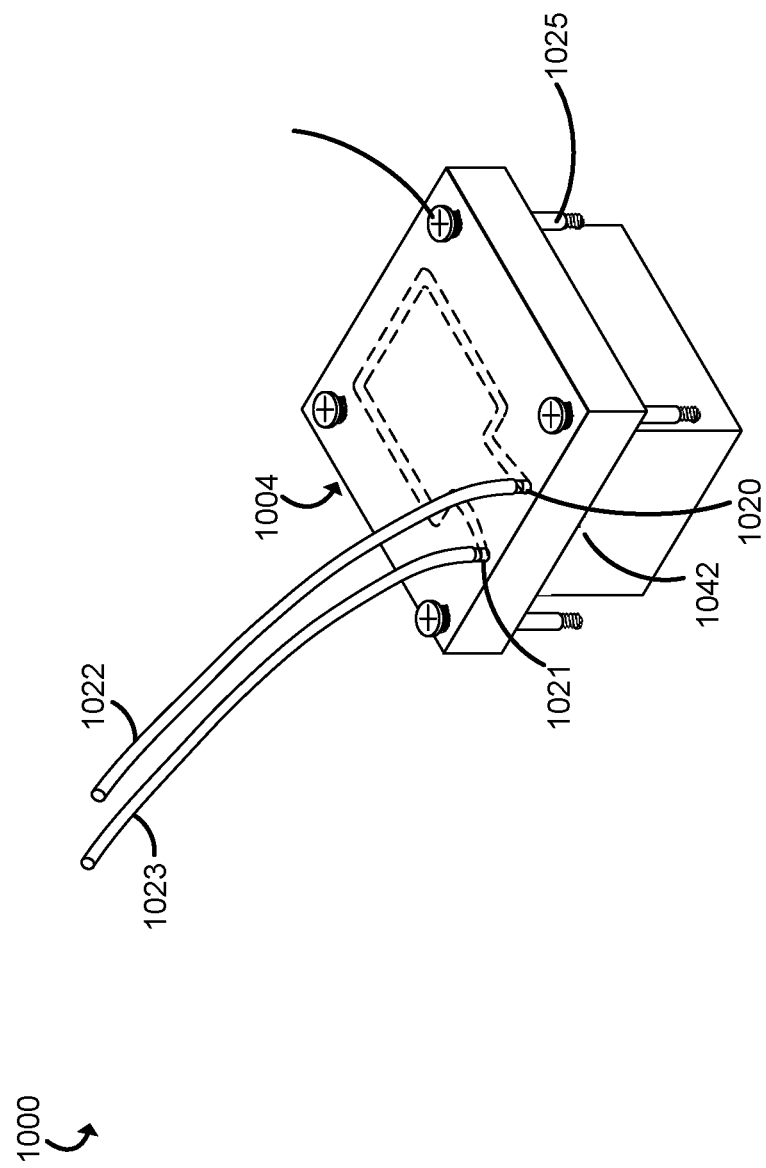
FIG. 15 is a perspective view of a second water block of the system of FIG. 10.
Figure 16:
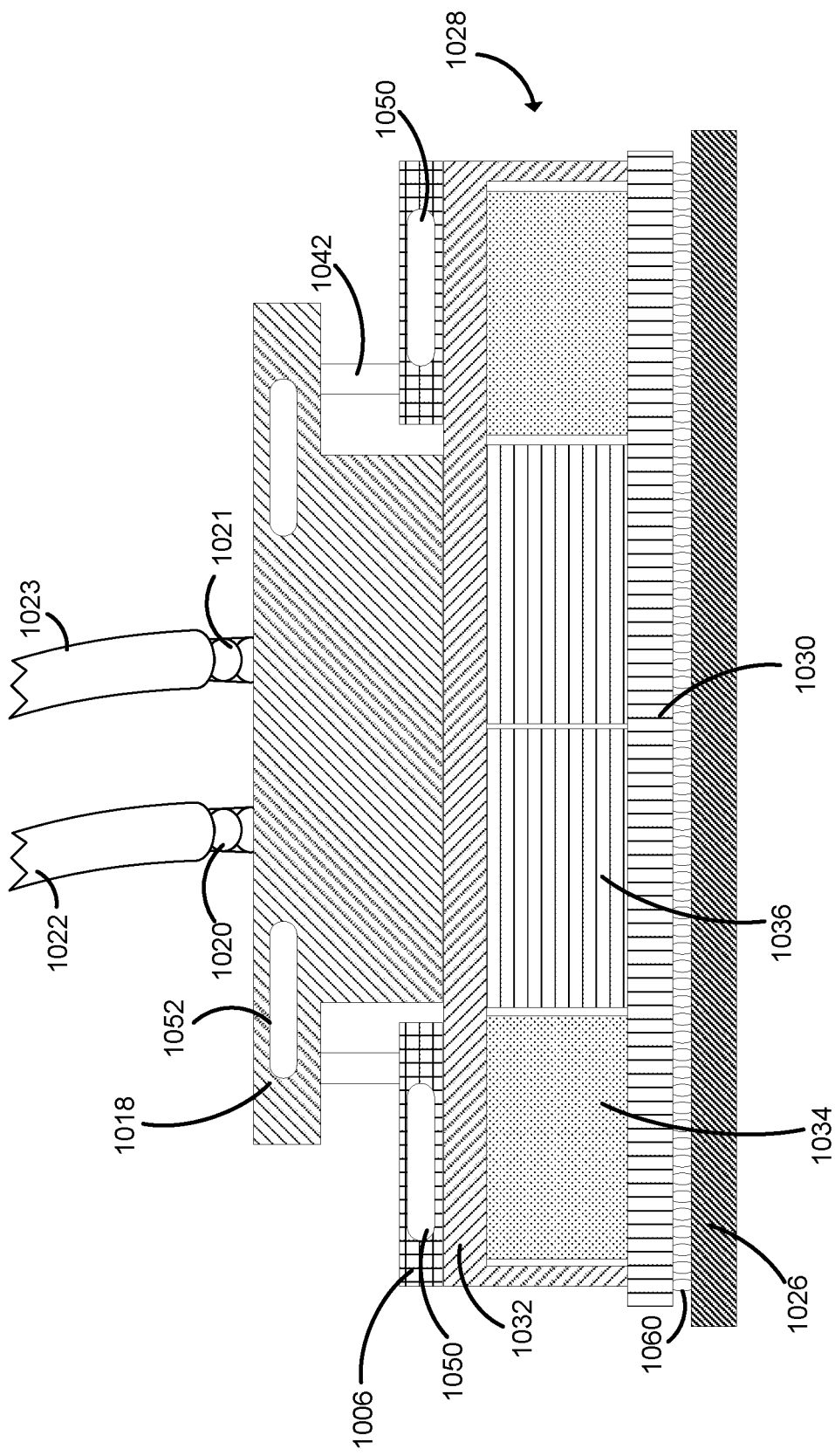
FIG. 16 is a cross-section view of the system of FIG. 10.
Figure 17:
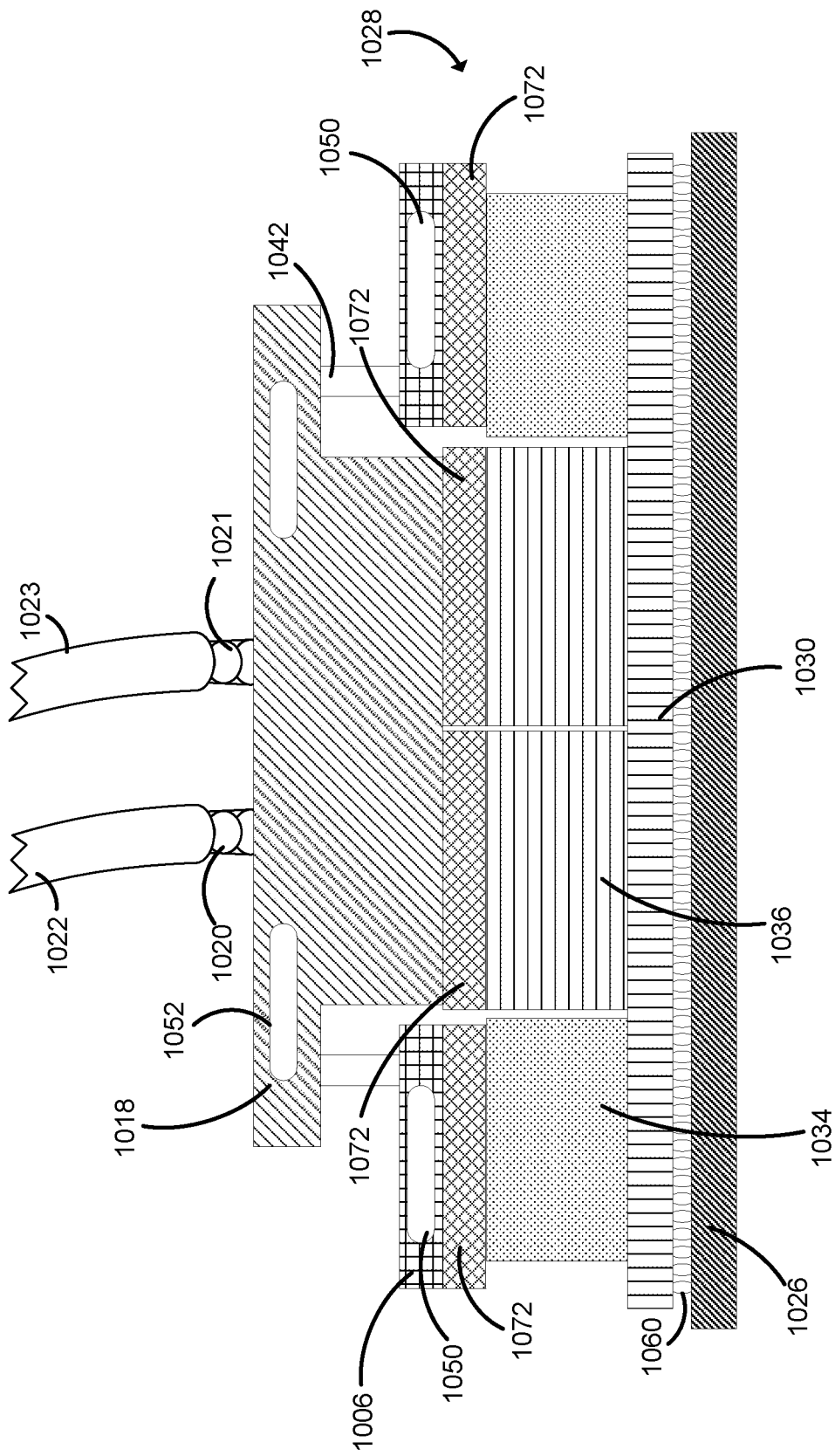
FIG. 17 is a cross-section view of an alternate embodiment of the system of FIG. 10.

FIGS. 11 & 12 show different embodiments of the integrated circuit component 1028 and the system board 1026 without the water blocks 1002, 1004, FIGS. 13-15 show various views of the water blocks 1002, 1004, and FIGS. 16 & 17 show cross-section views of the system 100. As shown in FIG. 11, in one embodiment, the integrated circuit component 1028 includes an integrated heat spreader (IHS) 1032 mounted on a substrate 1030. In the illustrative embodiment, the integrated circuit component 1028 includes one or more HBM dies 1034 and one or more processing dies 1036 covered by the IHS 1032.

In an alternate embodiment, in FIG. 12, the integrated circuit component 1028 does not have an IHS. As such, the bottom surface of the water blocks 1002, 1004 can contact the top surface of the dies 1034, 1036 directly. In some embodiments, the dies 1034, 1036 may be at different heights, and the water blocks 1002, 1004 may have different heights to accommodate the different heights of the dies 1034, 1036.

It should further be appreciated that, in the illustrative embodiment, the second water block 1004 is mechanically coupled to the first water block 1002. In the illustrative example, four screws 1024 fasten the base 1018 of the second water block 1004 to the base 1006 of the first water block 1002. A spacer 1025 is used to keep the pedestal 1042 at the correct height relative to the pedestals 1040. Because the first water block 1002 and the second water block 1004 are mechanically coupled, the water blocks 1002, 1004 can be fastened to the system board 1026 (such as by using spring screws 1016) all at once, thermally coupling both the first water block 1002 to the HBM dies 1034 and the second water block 1004 to the processing dies 1036.

The integrated circuit component 1028 may be similar to the integrated circuit 118 described above, a detailed description of which will not be repeated in the interest of clarity. In the illustrative embodiment, the integrated circuit component 1028 includes an IHS 1032, as shown in FIG. 11. In such embodiments, the pedestals 1040 of the first water block 1002 contact the IHS 1032 above the HBM dies 1034, and the pedestal 1042 of the second water block 1004 contacts the IHS 1032 above the processor dies 1036. In some embodiments, the integrated circuit component 1028 does not include an IHS, as shown in FIG. 12. In such embodiments, the pedestals 1040 of the first water block 1002 contact the HBM dies 1034, and the pedestal 1042 of the second water block 1004 contacts the processor dies 1036. The illustrative substrate 1030 may be similar to the substrate 130 described above, a detailed description of which will not be repeated in the interest of clarity.

The first water block 1002 has a base 1006 that has a gap in the center to provide access to the area above the processing dies 1036 by the second water block 1004. The first water block 1002 has two pedestals 1040 that extend from the base 1006. When the first water block 1002 is in place, the pedestals 1040 contacts the IHS 1032 above the HBM dies 1034 (or contacts the HBM dies 1034 directly). The first water block 1002 includes an inlet 1008 and an outlet 1010, which are connected by an internal channel 1050 that loops around the gap in the middle, fluidically coupling the inlet 1008 and the outlet 1010. The internal channel 1050 may include one or more fins or other internal or external structure coupled to the fluid in the internal channel 1050 to facilitate heat transfer. An inlet tube 1012 is connected to the inlet 1008, and an outlet tube 1014 is connected to the outlet 1010. Each of the inlet tube 1012 and outlet tube 1014 may be any suitable material, such as polyvinyl chloride (PVC). In use, water or another fluid flows through the tubes 1012, 1014 and internal channel 1050, absorbing heat from the base 1006 and transporting it to a radiator, chiller, heat exchanger, and/or the like. In some embodiments, a water block may be referred to as a cold plate.

The second water block 1004 has a base 1018 from which a pedestal 1042 extends. When the second water block 1004 is in place, the pedestal contacts the IHS 1032 about the processing dies 1036 (or contacts the processing dies 1036 directly). The second water block 1004 includes an inlet 1020 and an outlet 1021, which are connected by an internal channel 1070 that passes through the base 1018 and/or the pedestal 1042 (see FIG. 16). An inlet tube 1022 is connected to the inlet 1020, and an outlet tube 1023 is connected to the outlet 1021. Each of the inlet tube 1020 and outlet tube 1021 may be any suitable material, such as polyvinyl chloride (PVC). In use, water or another fluid flows through the tubes 1022, 1023, absorbing heat from the base 1018 and transporting it to a radiator, chiller, heat exchanger, and/or the like.

The first water block 1002 may be made from any suitable material. In the illustrative embodiment, the base 1006 and pedestals 1040 made from a high-thermal-conductivity material, such as copper, aluminum, or another material with a thermal conductivity greater than 100 W/(m×K). In some embodiments, the base 1006 and the pedestal 1040 may be made of different material. For example, the base 1006 may be aluminum and the pedestal 1040 may be copper. In some embodiments, the base 1006 may have more than one layer of different materials.

The first water block 1002 may have any suitable shape or dimensions. For example, the first water block 1002 may have a width of 10-250 millimeters, a length of 10-250 millimeters, and/or a height of 5-100 millimeters. In the illustrative embodiment, the first water block 1002 has a width of about 75 millimeters, a length of about 75 millimeters, and a height of about 15 millimeters. The dimensions of the pedestal 1040 may be any suitable dimensions, such as a width of 10-150 millimeters, a length of 10-150 millimeters, and/or a height of 2-25 millimeters. In the illustrative embodiment, the pedestal 1040 has a length of 40 millimeters, a width of 10 millimeters, and a height of 3 millimeters. The gap in the first water block 1002 may be any suitable dimensions, such as a length and/or width of 5-200 millimeters. In the illustrative embodiment, the gap in the first water block 1002 has a length and width of 30 millimeters.

The first water block 1002 is a square shape. In other embodiments, the first water block 1002 may be any suitable shape, such as a rectangle, a circle, etc. The illustrative base 1006 has a flat surface on the bottom. In some embodiments, the first water block 1002 may include other heat-transferring components such as a thermoelectric heater/cooler. A thermoelectric cooler may be positioned at, e.g., the top or the bottom of the pedestal 1040.

The second water block 1004 is, in the illustrative embodiment, constructed similarly to the first water block 1002. For example, the base 1018 may be similar to the base 1006, a description of which will not be repeated in the interest of clarity. The illustrative base 1018 has a width of about 40 millimeters, a length of about 40 millimeters, and a height of about 15 millimeters.

The pedestals 1042 are configured to conduct heat from the IHS 1032 to the base 1018. The pedestals 1042 may be any suitable material, such as copper, aluminum, or other material with a high thermal conductivity. The pedestals 1042 may be any suitable dimensions, such as a width of 10-250 millimeters, a length of 10-250 millimeters, and/or a height of 2-50 millimeters. In the illustrative embodiment, the pedestals 1042 have a width of about 25 millimeters, a length of about 25 millimeters, and a height of about 20 millimeters. In the illustrative embodiments, the lower surface of the pedestal 1042 is coplanar with the lower surface of the pedestals 1040, allowing both pedestals 1042, 1040 to contact the coplanar surface of the IHS 1032 simultaneously.

In the illustrative embodiment, the second water block 1004 is fastened to the first water block 1002 by fasteners 1024. In the illustrative embodiment, each of fasteners 1024 is embodied as screws or bolts. In other embodiments, the second water block 1004 may be fastened to the first water block 1002 by rivets, adhesives, or any other suitable mechanical connector that does not thermally couple the water blocks 1002, 1004. Spacers 1025 may be used to ensure that the base 1018 is not thermally coupled to the base 1006. The spacers 1025 may be made out of any suitable material, such as a plastic with a low thermal conductivity. In some embodiments, the spacers 1025 may be made out of a relatively high thermal conductivity material such as aluminum or steel. However, in should be appreciated that the cross-sectional area of the spacers 1025 is so small enough such that such spacers 1025 would not cause the base 1018 to be thermally coupled to the base 1006. In the illustrative embodiment, the gap between the pedestal 1042 and the base 1006 is empty (i.e., filled with air). In some embodiments, an insulator may fill some or all of the gap between the pedestal 1042 and the base 1006, further reducing heat flow between the components.

In some embodiments, the first water block 1002 and the second water block 1004 may be manufactured together in any suitable manner, such as extrusion, stamping, forging, machining, 3D printing, etc. In such an embodiment, the first water block 1002 and the second water block 1004 may be mechanically integrated without being thermally coupled.

The illustrative first water block 1002 is fastened to the system board 1026 by fasteners 1016. In the illustrative embodiment, fasteners 1016 are embodied as screws or bolts. Fasteners 1016 may have a spring that applies a downward force on the base 1006. The fasteners 1016 can screw directly into threaded holes of the system board 1026 or may be secured by, e.g., a nut. Additionally or alternatively, the fasteners 1016 may be embodied as any other suitable type of fastener, such as a torsion fastener, a spring screw, one or more clips, a land grid array (LGA) loading mechanism, and/or a combination of any suitable types of fasteners. In the illustrative embodiment, the fasteners 1016 are removable. In other embodiments, some or all of the fasteners 1016 may permanently secure the first water block 1002 to the system board 1026. In some embodiments, the system board 1026 may include a bolster plate and/or a back plate, and the fasteners 1016 may fasten to the bolster plate and/or back plate.

In the illustrative embodiment, the system board 1026 may be embodied as a motherboard. Similar to the system board 116 described above, the system board 1026 may also be embodied as, e.g., a PCIe card, a peripheral card, a mezzanine card, etc. The system board 1026 may be similar to the system board 116, a description of which will not be repeated in the interest of clarity.

Figure 10:
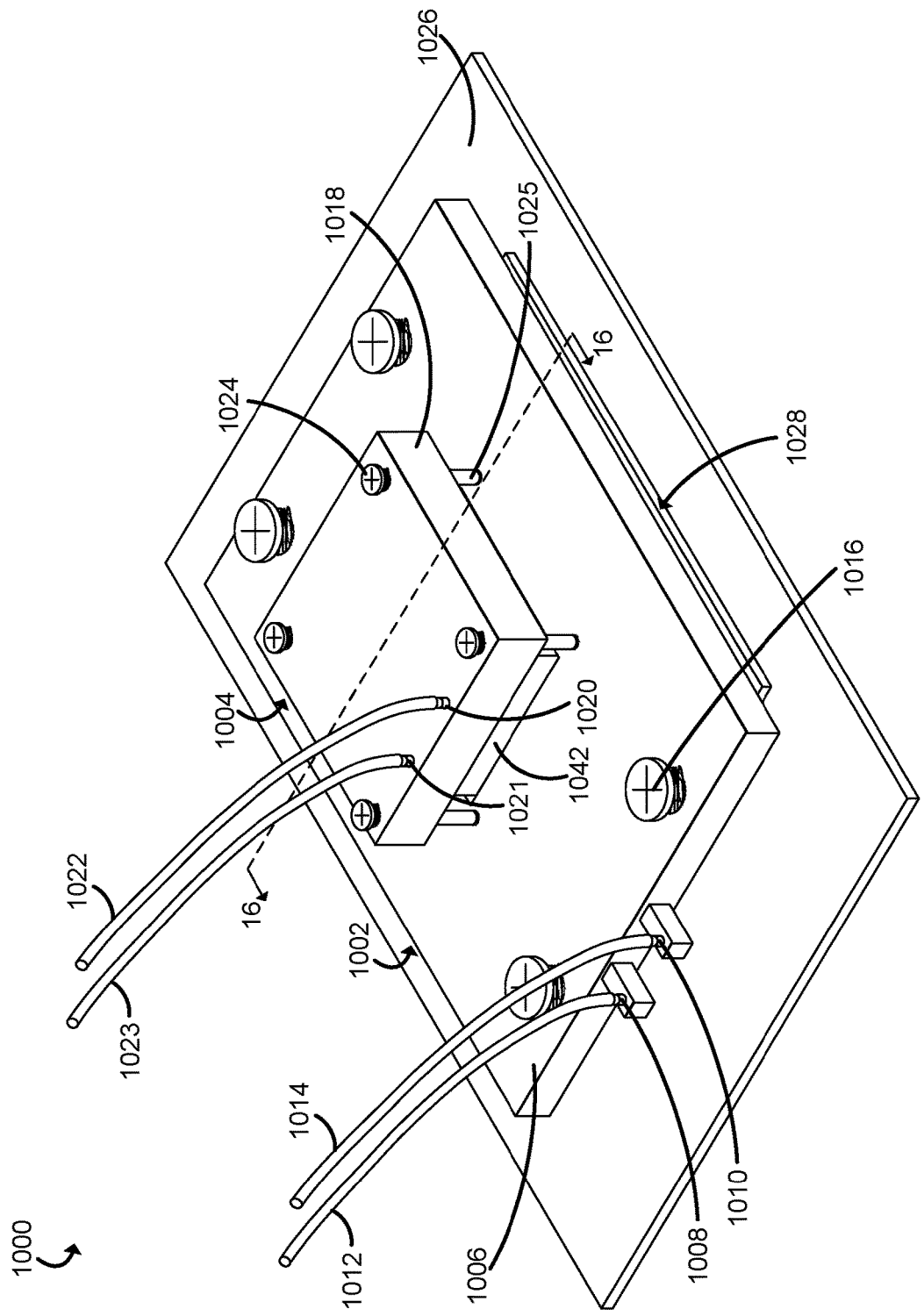
FIG. 10 is a perspective view of a simplified diagram of at least one embodiment of a system with thermally isolated and mechanically integrated water blocks.

Referring now to FIG. 16, in one embodiment, a cross-sectional view of the system 1000 is shown (corresponding to cross-section 16 in FIG. 10). In the illustrative embodiment, the integrated circuit component 1028 mates with several pins 1060 shown in FIG. 16 through a land grid array with a pad corresponding to each pin 1060. Additionally or alternatively, in some embodiments, the substrate 1030 may include a pin grid array with one or more pins that mate with a corresponding pin socket in a processor socket or a ball grid array.

Referring now to FIG. 17, in one embodiment, a cross-sectional view of the system 1000 is shown. In the embodiment shown in FIG. 17, the integrated circuit component 1028 does not include an IHS 1032, and there is a thermoelectric cooler 1072 between each die 1034, 1036 and the corresponding pedestal 1040, 1042. Each thermoelectric cooler 1072 may be controlled to remove heat from the corresponding die 1034, 1036. Each thermoelectric cooler 1072 may be controlled to be at a particular temperature based on a temperature sensor. The temperature sensor may be inside the pedestal 1040, 1042, underneath or above the thermoelectric cooler 1072, integrated into the corresponding die 1034, 1036, or any other suitable location. Each thermoelectric cooler 1072 may be controlled by a proportional-integral-differential (PID) controller or may be controlled by a processor (e.g., by a processing die 1036). It should be appreciated that the thermoelectric coolers 1072 allow the temperature of each die 1034, 1036 to be controlled independently.

It should be appreciated that different configurations are envisioned beyond those shown in FIGS. 10-17. For example, in the illustrative embodiment, the second water block 1004 passes through a gap in the first water block 1004. In other embodiments, the first water block 1004 may be in a different shape, such as a U-shape. In the illustrative embodiment, the height of the HBM dies 1034 are the same as the height of the processing dies 1036. In other embodiments, the HBM dies 1034 and the processing dies 1036 may be at different heights, and the pedestals 1040, 1042 may be at different heights to compensate. In the illustrative embodiment, there are two water blocks. In other embodiments, there may be three or more water blocks. For example, each of several HBM dies 1034 may have its own pedestal or its own water block coupled to it. In the illustrative embodiment, the second water block 1004 is mechanically fastened to the first water block 1002. In other embodiments, the various water blocks may all be fastened to, e.g., a single bracket, that is then fastened to the system board 1026. For example, in one embodiment, the various water blocks are all fastened to a single bracket with various springs. When the bracket is fastened to the system board 1026, the various water blocks are pressed down onto the corresponding dies or IHS by the springs simultaneously. In the illustrative embodiment, the two water blocks 1002, 1004 are thermally coupled to a single integrated circuit component 1028. In other embodiments, various water blocks may be coupled to different integrated circuit components, allowing separate thermal coupling of water blocks to different integrated circuit component packages with a single mechanical fastening to a system board 1026. For example, in one embodiment, each of several dies has a thermoelectric cooler on top of it, and each die is coupled to the same water block. Even though the dies are all coupled to the same water block, the different thermoelectric cooler on each one allows the temperature of each die to be controlled independently of the others.

It should be appreciated that any suitable feature of the embodiments described in regard to FIGS. 1-9 may be incorporated into any of the embodiments described in regard to FIGS. and any suitable feature of the embodiments described in regard to FIGS. 10-17 may be incorporated into any of the embodiments described in regard to FIGS. 1-9. For example, the IHS 1032 may have a slot similar to that in the IHS 132. In another example, the dies of the system 100 in FIGS. 1-9 may have thermoelectric coolers on top of them to control the temperature of the dies in a similar manner as for the system 1000.

The technologies described herein can be performed by or implemented in any of a variety of computing systems, including mobile computing systems (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blades, trays, sleds)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 18:
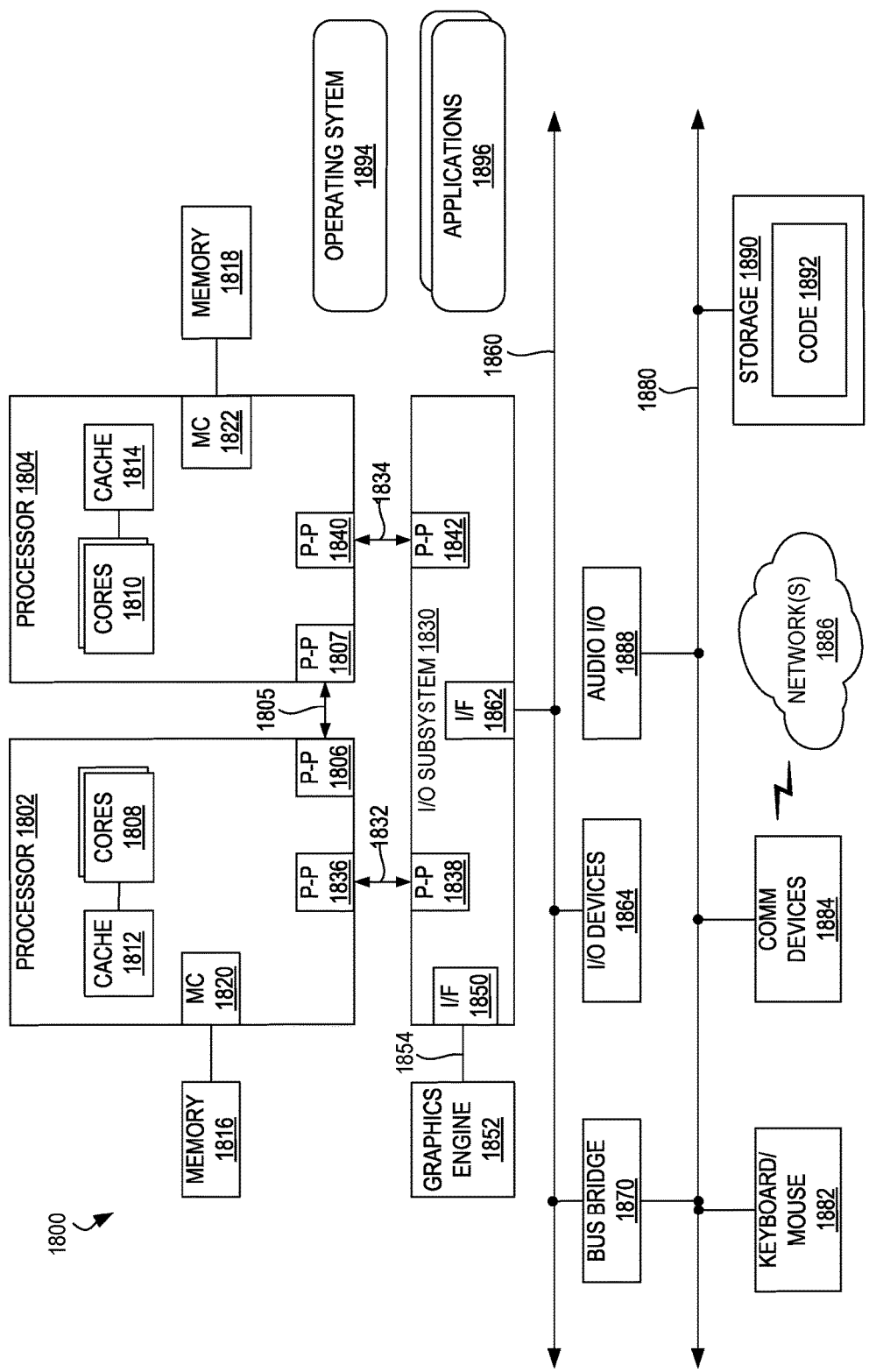
FIG. 18 is a block diagram of an exemplary computing system in which technologies described herein may be implemented.

FIG. 18 is a block diagram of a second example computing system in which technologies described herein may be implemented. Generally, components shown in FIG. 18 can communicate with other shown components, although not all connections are shown, for ease of illustration. The computing system 1800 is a multiprocessor system comprising a first processor unit 1802 and a second processor unit 1804 comprising point-to-point (P-P) interconnects. A point-to-point (P-P) interface 1806 of the processor unit 1802 is coupled to a point-to-point interface 1807 of the processor unit 1804 via a point-to-point interconnection 1805. It is to be understood that any or all of the point-to-point interconnects illustrated in FIG. 18 can be alternatively implemented as a multi-drop bus, and that any or all buses illustrated in FIG. 18 could be replaced by point-to-point interconnects.

The processor units 1802 and 1804 comprise multiple processor cores. Processor unit 1802 comprises processor cores 1808 and processor unit 1804 comprises processor cores 1810. Processor cores 1808 and 1810 can execute computer-executable instructions in a manner similar to that discussed below in connection with FIG. 19, or other manners.

Processor units 1802 and 1804 further comprise cache memories 1812 and 1814, respectively. The cache memories 1812 and 1814 can store data (e.g., instructions) utilized by one or more components of the processor units 1802 and 1804, such as the processor cores 1808 and 1810. The cache memories 1812 and 1814 can be part of a memory hierarchy for the computing system 1800. For example, the cache memories 1812 can locally store data that is also stored in a memory 1816 to allow for faster access to the data by the processor unit 1802. In some embodiments, the cache memories 1812 and 1814 can comprise multiple cache levels, such as level 1 (L1), level 2 (L2), level 3 (L3), level 4 (L4), and/or other caches or cache levels, such as a last level cache (LLC). Some of these cache memories (e.g., L2, L3, L4, LLC) can be shared among multiple cores in a processor unit. One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 1800 is shown with two processor units, the computing system 1800 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 1800 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1802 and 1804 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/ output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component.

Processor units 1802 and 1804 further comprise memory controller logic (MC) 1820 and 1822. As shown in FIG. 18, MCs 1820 and 1822 control memories 1816 and 1818 coupled to the processor units 1802 and 1804, respectively. The memories 1816 and 1818 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1820 and 1822 are illustrated as being integrated into the processor units 1802 and 1804, in alternative embodiments, the MCs can be external to a processor unit.

Processor units 1802 and 1804 are coupled to an Input/Output (I/O) subsystem 1830 via point-to-point interconnections 1832 and 1834. The point-to-point interconnection 1832 connects a point-to-point interface 1836 of the processor unit 1802 with a point-to-point interface 1838 of the I/O subsystem 1830, and the point-to-point interconnection 1834 connects a point-to-point interface 1840 of the processor unit 1804 with a point-to-point interface 1842 of the I/O subsystem 1830. Input/Output subsystem 1830 further includes an interface 1850 to couple the I/O subsystem 1830 to a graphics engine 1852. The I/O subsystem 1830 and the graphics engine 1852 are coupled via a bus 1854.

The Input/Output subsystem 1830 is further coupled to a first bus 1860 via an interface 1862. The first bus 1860 can be a Peripheral Component Interconnect Express (PCIe) bus or any other type of bus. Various I/O devices 1864 can be coupled to the first bus 1860. A bus bridge 1870 can couple the first bus 1860 to a second bus 1880. In some embodiments, the second bus 1880 can be a low pin count (LPC) bus. Various devices can be coupled to the second bus 1880 including, for example, a keyboard/mouse 1882, audio I/O devices 1888, and a storage device 1890, such as a hard disk drive, solid-state drive, or another storage device for storing computer-executable instructions (code) 1892 or data. The code 1892 can comprise computer-executable instructions for performing methods described herein. Additional components that can be coupled to the second bus 1880 include communication device(s) 1884, which can provide for communication between the computing system 1800 and one or more wired or wireless networks 1886 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

In embodiments where the communication devices 1884 support wireless communication, the communication devices 1884 can comprise wireless communication components coupled to one or more antennas to support communication between the computing system 1800 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1800 can comprise removable memory such as flash memory cards (e.g., SD (Secure Digital) cards), memory sticks, Subscriber Identity Module (SIM) cards). The memory in system 1800 (including caches 1812 and 1814, memories 1816 and 1818, and storage device 1890) can store data and/or computer-executable instructions for executing an operating system 1894 and application programs 1896. Example data includes web pages, text messages, images, sound files, and video data to be sent to and/or received from one or more network servers or other devices by the system 1800 via the one or more wired or wireless networks 1886, or for use by the system 1800. The system 1800 can also have access to external memory or storage (not shown) such as external hard drives or cloud-based storage.

The operating system 1894 can control the allocation and usage of the components illustrated in FIG. 18 and support the one or more application programs 1896. The application programs 1896 can include common computing system applications (e.g., email applications, calendars, contact managers, web browsers, messaging applications) as well as other computing applications.

The computing system 1800 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 1800. External input and output devices can communicate with the system 1800 via wired or wireless connections.

In addition, the computing system 1800 can provide one or more natural user interfaces (NUIs). For example, the operating system 1894 or applications 1896 can comprise speech recognition logic as part of a voice user interface that allows a user to operate the system 1800 via voice commands. Further, the computing system 1800 can comprise input devices and logic that allows a user to interact with computing the system 1800 via body, hand or face gestures.

The system 1800 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 1800 can further comprise one or more additional antennas coupled to one or more additional receivers, transmitters, and/or transceivers to enable additional functions.

It is to be understood that FIG. 18 illustrates only one example computing system architecture. Computing systems based on alternative architectures can be used to implement technologies described herein. For example, instead of the processors 1802 and 1804 and the graphics engine 1852 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 18. Moreover, the illustrated components in FIG. 18 are not required or all-inclusive, as shown components can be removed and other components added in alternative embodiments.

Figure 19:
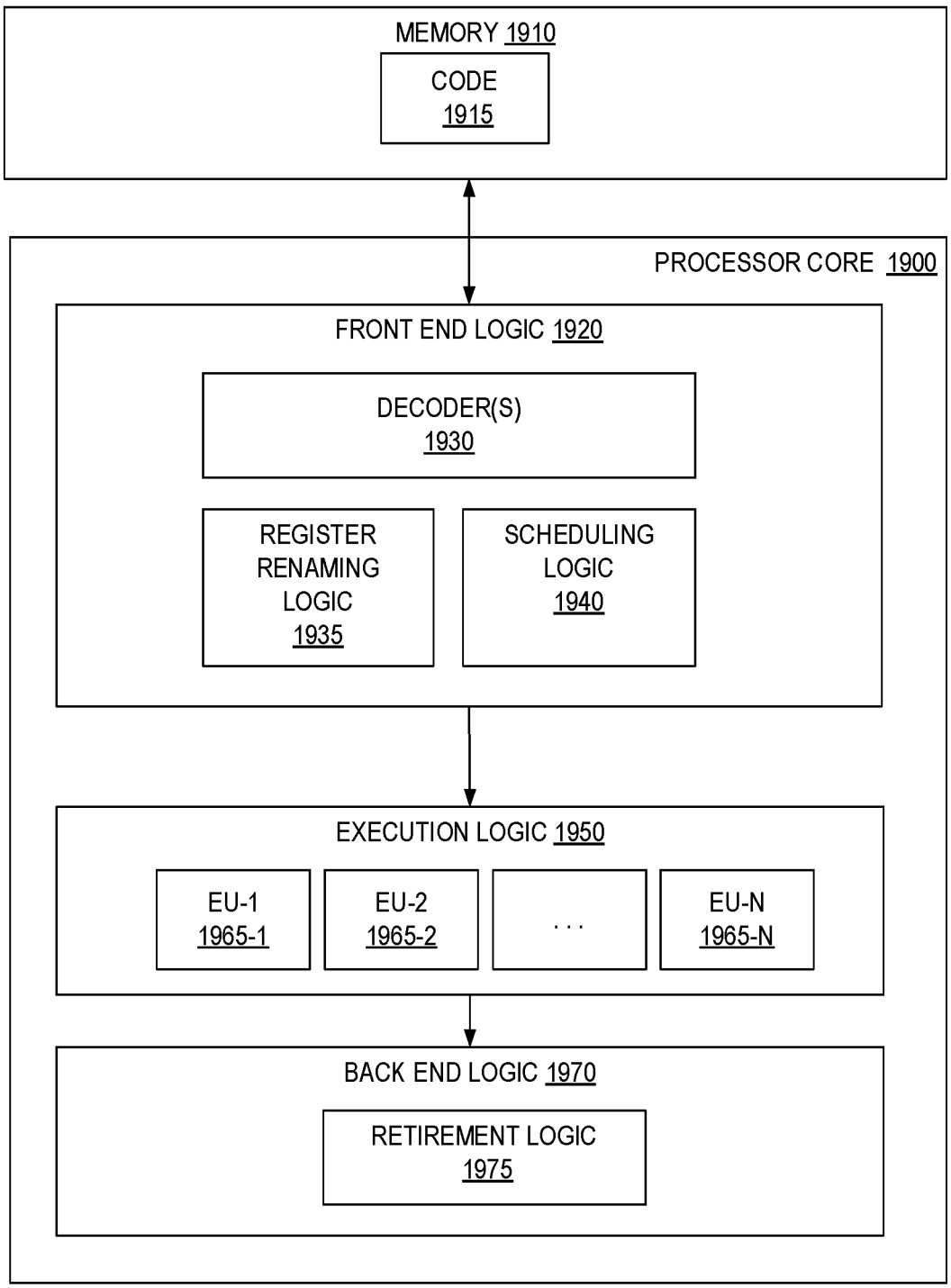
FIG. 19 is a block diagram of an exemplary processor unit that can execute instructions as part of implementing technologies described herein.

FIG. 19 is a block diagram of an example processor unit 1900 to execute computer-executable instructions as part of implementing technologies described herein. The processor unit 1900 can be a single-threaded core or a multithreaded core in that it may include more than one hardware thread context (or "logical processor") per processor unit.

FIG. 19 also illustrates a memory 1910 coupled to the processor unit 1900. The memory 1910 can be any memory described herein or any other memory known to those of skill in the art. The memory 1910 can store computer-executable instructions 1915 (code) executable by the processor core 1900.

The processor unit comprises front-end logic 1920 that receives instructions from the memory 1910. An instruction can be processed by one or more decoders 1930. The decoder 1930 can generate as its output a micro-operation such as a fixed width micro operation in a predefined format, or generate other instructions, microinstructions, or control signals, which reflect the original code instruction. The front-end logic 1920 further comprises register renaming logic 1935 and scheduling logic 1940, which generally allocate resources and queues operations corresponding to converting an instruction for execution.

The processor unit 1900 further comprises execution logic 1950, which comprises one or more execution units (EUs) 1965-1 through 1965-N. Some processor unit embodiments can include a number of execution units dedicated to specific functions or sets of functions. Other embodiments can include only one execution unit or one execution unit that can perform a particular function. The execution logic 1950 performs the operations specified by code instructions. After completion of execution of the operations specified by the code instructions, back-end logic 1970 retires instructions using retirement logic 1975. In some embodiments, the processor unit 1900 allows out of order execution but requires in-order retirement of instructions. Retirement logic 1975 can take a variety of forms as known to those of skill in the art (e.g., re-order buffers or the like).

The processor unit 1900 is transformed during execution of instructions, at least in terms of the output generated by the decoder 1930, hardware registers and tables utilized by the register renaming logic 1935, and any registers (not shown) modified by the execution logic 1950.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry. A computing system referred to as being programmed to perform a method can be programmed to perform the method via software, hardware, firmware or combinations thereof.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid-state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes a system comprising a first water block comprising a first base, the first water block comprising a first inlet and a first outlet, wherein the first inlet is connected to the first outlet by a first internal channel defined in the first water block; a second water block comprising a second base, the second water block comprising a second inlet and a second outlet, wherein the second inlet is connected to the second outlet by a second internal channel defined in the second water block; and one or more fasteners mechanically coupling the first water block to the second water block, wherein the first water block is not thermally coupled to the second water block.

Example 2 includes the subject matter of Example 1, and wherein the first internal channel loops around a gap in the first base, wherein the second water block comprises one or more pedestals extending from the second base, wherein at least one of the one or more pedestals extends through the gap in the first base.

Example 3 includes the subject matter of any of Examples 1 and 2, and wherein the first water block comprises one or more pedestals extending from the first base, wherein a bottom surface of the one or more pedestals of the first water block is coplanar with a bottom surface of each of the one or more pedestals of the second water block.

Example 4 includes the subject matter of any of Examples 1-3, and wherein there is an air gap between the first water block and the second water block.

Example 5 includes the subject matter of any of Examples 1-4, and wherein there is an insulating material between the first water block and the second water block.

6. The system of claim 1, the system further comprising an integrated circuit component comprising an integrated heat spreader, wherein the first water block is thermally coupled to a first portion of the integrated heat spreader, wherein the second water block is thermally coupled to a second portion of the integrated heat spreader.

Example 7 includes the subject matter of any of Examples 1-6, and wherein the integrated circuit component comprises a plurality of high-bandwidth memory dies and a plurality of graphics processing dies, wherein each of the plurality of graphics processing dies is under the first portion of the integrated heat spreader, and wherein each of the plurality of high-bandwidth memory dies is under the second portion of the integrated heat spreader.

Example 8 includes the subject matter of any of Examples 1-7, and wherein the integrated circuit component comprises a plurality of dies of a first type and a plurality of dies of a second type different from the first type, wherein each of the plurality of dies of the first type is under the first portion of the integrated heat spreader, and wherein each of the plurality of dies of the second type is under the second portion of the integrated heat spreader.

Example 9 includes the subject matter of any of Examples 1-8, and wherein the first portion of the integrated heat spreader is separated from the second portion of the integrated heat spreader by a slot in the integrated heat spreader.

Example 10 includes the subject matter of any of examples 1-9, and further comprising an integrated circuit component comprising a first die and a second die, wherein the first water block is in contact with the first die, and wherein the second water block is in contact with the second die.

Example 11 includes the subject matter of any of Examples 1-10, and wherein a height of the first die is different from a height of the second die.

Example 10 includes the subject matter of any of examples 1-11, and further comprising an integrated circuit component; a first thermoelectric cooler thermally coupled to the integrated circuit component and the first base; and a second thermoelectric cooler thermally coupled to the integrated circuit component and the second base.

Example 13 includes a heat sink comprising a first sub-heat sink comprising a first heat sink base and a first plurality of heat sink fins attached to the first heat sink base; a second sub-heat sink comprising a second heat sink base and a second plurality of heat sink fins attached to the second heat sink base; and one or more fasteners mechanically coupling the first sub-heat sink to the second sub-heat sink, wherein the first sub-heat sink is not thermally coupled to the second sub-heat sink.

Example 14 includes the subject matter of Example 13, and wherein the first sub-heat sink comprises a pedestal extending from the first heat sink base, wherein the second sub-heat sink comprises one or more pedestals, wherein each of the one or more pedestals of the second sub-heat sink is thermally coupled to the second heat sink base with use of one or more heat pipes.

Example 15 includes the subject matter of any of Examples 13 and 14, and wherein a height of the pedestal extending from the first heat sink base is greater than a height of each of the one or more pedestals of the second sub-heat sink, wherein a bottom surface of the pedestal extending from the first heat sink base is coplanar with a bottom surface of each of the one or more pedestals of the second sub-heat sink.

Example 16 includes the subject matter of any of Examples 13-15, and wherein each of the one or more pedestals of the second sub-heat sink are displaced along a first axis relative to the pedestal extending from the first heat sink base, wherein the second heat sink base is displaced along a second axis relative to the first heat sink base, wherein the first axis is perpendicular to the second axis, wherein the first axis and second axis span the plane of the bottom surface of the pedestal extending from the first heat sink base.

Example 17 includes the subject matter of any of Examples 13-16, and wherein there is an air gap between the first heat sink base and the second heat sink base.

Example 18 includes the subject matter of any of Examples 13-17, and wherein there is an insulating material between the first heat sink base and the second heat sink base.

Example 19 includes a system comprising the heat sink of claim 13, the system further comprising an integrated circuit component comprising an integrated heat spreader, wherein the first sub-heat sink is thermally coupled to a first portion of the integrated heat spreader, wherein the second sub-heat sink is thermally coupled to a second portion of the integrated heat spreader, wherein the first portion of the integrated heat spreader is separated from the second portion of the integrated heat spreader by a slot in the integrated heat spreader.

Example 20 includes the subject matter of Example 19, and wherein the integrated circuit component comprises a plurality of high-bandwidth memory dies and a plurality of graphics processing dies, wherein each of the plurality of graphics processing dies is under the first portion of the integrated heat spreader and wherein each of the plurality of high-bandwidth memory dies is under the second portion of the integrated heat spreader.

Example 21 includes the subject matter of any of Examples 19 and 20, and wherein the integrated circuit component comprises a plurality of dies of a first type and a plurality of dies of a second type different from the first type, wherein each of the plurality of dies of the first type is under the first portion of the integrated heat spreader, and wherein each of the plurality of dies of the second type is under the second portion of the integrated heat spreader.

Example 22 includes a system comprising the heat sink of claim 13, the system further comprising an integrated circuit component comprising a first die and a second die, wherein a pedestal of the first sub-heat sink is in contact with the first die, and wherein a pedestal of the second sub-heat sink is in contact with the second die.

Example 23 includes the subject matter of Example 22, and wherein a height of the first die is different from a height of the second die.

Example 24 includes a system comprising the heat sink of claim 13, the system further comprising an integrated circuit component; a first thermoelectric cooler thermally coupled to the integrated circuit component and the heat sink base of the first sub-heat sink; and a second thermoelectric cooler thermally coupled to the integrated circuit component and the heat sink base of the second sub-heat sink.

Example 25 includes a system comprising a water block comprising an inlet and an outlet, wherein the inlet is connected to the outlet by an internal channel defined in the water block; an integrated circuit component comprising a first die and a second die; a first thermoelectric cooler thermally coupled to the first die and the water block; and a second thermoelectric cooler thermally coupled to the second die and the water block.

Example 26 includes the subject matter of Example 25, and wherein a height of the first die is different from a height of the second die.

Example 27 includes a system comprising a first heat transfer means thermally coupled to an integrated circuit component to absorb heat from the integrated circuit component; a second heat transfer means thermally coupled to the integrated circuit component to absorb heat from the integrated circuit component; wherein the first heat transfer means is not thermally coupled to the second heat transfer means.

Example 28 includes the subject matter of Example 27, and wherein there is an air gap between the first heat transfer means and the second heat transfer means.

Example 29 includes the subject matter of any of Examples 27 and 28, and wherein there is an insulating material between first heat transfer means and the second heat transfer means.

Example 30 includes the subject matter of any of Examples 27-29, and comprising the integrated circuit component comprising an integrated heat spreader, wherein the first heat transfer means is thermally coupled to a first portion of the integrated heat spreader, wherein the first heat transfer means is thermally coupled to a second portion of the integrated heat spreader.

Example 31 includes the subject matter of any of Examples 27-30, and wherein the integrated circuit component comprises a plurality of high-bandwidth memory dies and a plurality of graphics processing dies, wherein each of the plurality of graphics processing dies is under the first portion of the integrated heat spreader, and wherein each of the plurality of high-bandwidth memory dies is under the second portion of the integrated heat spreader.

Example 32 includes the subject matter of any of Examples 27-31, and wherein the integrated circuit component comprises a plurality of dies of a first type and a plurality of dies of a second type different from the first type, wherein each of the plurality of dies of the first type is under the first portion of the integrated heat spreader, and wherein each of the plurality of dies of the second type is under the second portion of the integrated heat spreader.

Example 33 includes the subject matter of any of Examples 27-32, and wherein the first portion of the integrated heat spreader is separated from the second portion of the integrated heat spreader by a slot in the integrated heat spreader.

Example 34 includes the subject matter of any of Examples 27-33, and comprising the integrated circuit component comprising a first die and a second die, wherein the first heat transfer means is in contact with the first die, and wherein the second heat transfer means is in contact with the second die.

Example 35 includes the subject matter of any of Examples 27-34, and wherein a height of the first die is different from a height of the second die.

Example 36 includes the subject matter of any of Examples 27-35, and comprising the integrated circuit component; a first thermoelectric cooler thermally coupled to the integrated circuit component and the first heat transfer means and a second thermoelectric cooler thermally coupled to the integrated circuit component and the second heat transfer means.

The invention claimed is:
1. A system comprising:
a first water block including a first base, the first water block including a first inlet and a first outlet, the first inlet is connected to the first outlet by a first internal channel defined in the first water block, the first base has a gap;
a second water block including a second base, the second water block including a second inlet and a second outlet, the second inlet is connected to the second outlet by a second internal channel defined in the second water block, the second water block includes a pedestal extending from the second base and through the gap in the first base; and a fastener mechanically coupling the first water block to the second water block.

2. The system of claim 1, wherein the first internal channel loops around the gap in the first base.

3. The system of claim 2, the first water block includes a pedestal extending from the first base, and a bottom surface of the pedestal of the first water block is coplanar with a bottom surface of the pedestal of the second water block.

4. The system of claim 1, wherein there is an air gap between the first water block and the second water block.

5. The system of claim 1, wherein there is an insulating material between the first water block and the second water block.

6. The system of claim 1, including:

an integrated circuit component including an integrated heat spreader, the first water block is thermally coupled to a first portion of the integrated heat spreader, and the second water block is thermally coupled to a second portion of the integrated heat spreader.

7. The system of claim 6, wherein the integrated circuit component includes a high-bandwidth memory die and a graphics processing die, the graphics processing die is under the first portion of the integrated heat spreader, and the high-bandwidth memory die is under the second portion of the integrated heat spreader.

8. The system of claim 6, wherein the integrated circuit component includes a die of a first type and a die of a second type different from the first type, the die of the first type is under the first portion of the integrated heat spreader, and the die of the second type is under the second portion of the integrated heat spreader.

9. The system of claim 6, wherein the first portion of the integrated heat spreader is separated from the second portion of the integrated heat spreader by a slot in the integrated heat spreader.

10. The system of claim 1, including:

an integrated circuit component including a first die and a second die, the first water block is in contact with the first die, and the second water block is in contact with the second die.

11. A system comprising:

a system board;

an integrated circuit component on the system board;

a first water block carried by the system board such that the integrated circuit component is between the first water block and the system board, the first water block having a first base with a first side facing the system board and a second side opposite the first side, the first base having an opening extending between the first side and the second side; and a second water block coupled to the first water block, the second water block having a second base spaced from the second side of the first base, the second water block having a pedestal extending from the second base and into the opening of the first base.

12. The system of claim 11, wherein the pedestal extends through the opening in the first base.

13. The system of claim 12, wherein the pedestal is a second pedestal, and the first water block includes a first pedestal extending from the first side of the first base.

14. The system of claim 13, wherein a bottom surface of the first pedestal and a bottom surface of the second pedestal are coplanar.

15. The system of claim 13, wherein a bottom surface of the first pedestal is in contact with a first die of the integrated circuit component and a bottom surface of the second pedestal is in contact with a second die of the integrated circuit component.

16. The system of claim 13, wherein a bottom surface of the first pedestal is in contact with a first portion of an integrated heat spreader (IHS) of the integrated circuit component and a bottom surface of the second pedestal is in contact with a second portion of the IHS.

17. The system of claim 11, wherein the first water block has a first internal channel defined in the first base to receive a fluid, the first internal channel extending at least partially around the opening.

18. The system of claim 11, including a spacer between the second base and the second side of the first base.

19. The system of claim 11, wherein a peripheral outer surface of the pedestal is spaced from a peripheral inner surface of the first base such that an air gap is between the pedestal and the first base.

* * * * *